United States Patent
Birmingham

(10) Patent No.: US 11,244,816 B2
(45) Date of Patent: ***Feb. 8, 2022

(54) METHOD OF MANUFACTURING AND OPERATING NANO-SCALE ENERGY CONVERSION DEVICE

(71) Applicant: Birmingham Technologies, Inc., Arlington, VA (US)

(72) Inventor: Joseph Birmingham, Arlington, VA (US)

(73) Assignee: Birmingham Technologies, Inc., Arlington, VA (US)

( * ) Notice: Subject to any disclaimer, the term of this patent is extended or adjusted under 35 U.S.C. 154(b) by 202 days.

This patent is subject to a terminal disclaimer.

(21) Appl. No.: 16/284,987

(22) Filed: Feb. 25, 2019

(65) Prior Publication Data

US 2020/0274045 A1 Aug. 27, 2020

(51) Int. Cl.
*H01J 45/00* (2006.01)
*H01L 29/43* (2006.01)
(Continued)

(52) U.S. Cl.
CPC ............... *H01J 45/00* (2013.01); *H01J 1/35* (2013.01); *H01L 29/401* (2013.01); *H01L 29/43* (2013.01);
(Continued)

(58) Field of Classification Search
None
See application file for complete search history.

(56) References Cited

U.S. PATENT DOCUMENTS 2,876,368 A 3/1959 Thomas
4,264,641 A 4/1981 Mahoney et al.
(Continued)

FOREIGN PATENT DOCUMENTS

JP 2006086510 3/2006
JP 4901049 3/2012
(Continued)

OTHER PUBLICATIONS

Birmingham, J.G., "DEP-Enhanced Micro-Injector Array for Liquid Fuel Atomizer," Final Report for U.S. Army SBIR 02.2 N02-148 (2001).
(Continued)

*Primary Examiner* — Tamir Ayad
(74) *Attorney, Agent, or Firm* — Lieberman & Brandsdorfer, LLC

(57) ABSTRACT

Embodiments relate to methods of manufacturing and operating nano-scale energy converters and electric power generators. The nano-scale energy converters include two electrodes separated a predetermined distance. The first electrode is manufactured to have a first work function value. The second electrode is manufactured to have a second work function value different from the first work function value. A cavity is formed between the first and second electrodes, and a nanofluid is disposed in the cavity. The nanofluid includes a plurality of nanoparticles, with the nanoparticles having a third work function value that is greater than the first and second work function values. The relationship of the work function values of the nanoparticles
(Continued)

to the work function values of the electrodes optimizes transfer of electrons to the nanoparticles through Brownian motion and electron hopping.

25 Claims, 17 Drawing Sheets

(51) Int. Cl.
  *H01J 1/35* (2006.01)
  *H01L 29/40* (2006.01)
  *H01L 35/26* (2006.01)
  *H01L 35/32* (2006.01)
  *H01L 35/16* (2006.01)
  *H01L 35/08* (2006.01)
  *H01L 35/34* (2006.01)

(52) U.S. Cl.
  CPC .............. *H01L 35/08* (2013.01); *H01L 35/16* (2013.01); *H01L 35/26* (2013.01); *H01L 35/32* (2013.01); *H01L 35/34* (2013.01)

(56) References Cited

U.S. PATENT DOCUMENTS

| | | |
|---|---|---|
| 4,628,143 A | 12/1986 | Brotz |
| 4,762,975 A | 8/1988 | Mahoney et al. |
| 4,900,368 A | 2/1990 | Brotz |
| 5,008,579 A | 4/1991 | Conley et al. |
| 5,578,886 A | 11/1996 | Holmlid et al. |
| 5,606,213 A | 2/1997 | Kherani et al. |
| 5,787,965 A | 8/1998 | Sterett et al. |
| 5,960,853 A | 10/1999 | Sterett et al. |
| 5,989,824 A | 11/1999 | Birmingham et al. |
| 5,994,638 A | 11/1999 | Edelson |
| 6,062,392 A | 5/2000 | Birmingham et al. |
| 6,110,247 A | 8/2000 | Birmingham et al. |
| 6,287,714 B1 | 9/2001 | Xiao et al. |
| 6,294,858 B1 | 9/2001 | King et al. |
| 6,492,792 B1 | 12/2002 | Johnson, Jr. et al. |
| 6,722,872 B1 | 4/2004 | Swanson et al. |
| 6,774,532 B1 | 8/2004 | Marshall et al. |
| 7,073,561 B1 | 7/2006 | Henn |
| 7,081,684 B2 | 7/2006 | Patel et al. |
| 7,259,109 B2 | 8/2007 | Meagley |
| 7,327,026 B2 | 2/2008 | Shimogishi et al. |
| 7,524,528 B2 | 4/2009 | Kodas et al. |
| 7,651,926 B2 | 1/2010 | Jacobson et al. |
| 7,701,576 B2 | 4/2010 | Moore et al. |
| 7,906,182 B1 | 3/2011 | Schlaf |
| 8,093,144 B2 | 1/2012 | Jacobson et al. |
| 8,182,982 B2 | 5/2012 | Kobrin |
| 8,192,920 B2 | 6/2012 | Kobrin |
| 8,318,386 B2 | 11/2012 | Kobrin |
| 8,334,217 B2 | 12/2012 | Kobrin |
| 8,367,525 B2 | 2/2013 | Jacobson et al. |
| 8,425,789 B2 | 4/2013 | Kobrin |
| 8,518,633 B2 | 8/2013 | Kobrin et al. |
| 8,621,245 B2 | 12/2013 | Shearer et al. |
| 8,816,633 B1 | 8/2014 | Neal et al. |
| 8,907,352 B2 | 12/2014 | Naito |
| 9,069,244 B2 | 6/2015 | Kobrin |
| 9,073,937 B2 | 7/2015 | Frazier et al. |
| 9,116,430 B2 | 8/2015 | Kobrin et al. |
| 9,166,405 B2 | 10/2015 | Brandt et al. |
| 9,244,356 B1 | 1/2016 | Kobrin et al. |
| 9,465,296 B2 | 10/2016 | Kobrin |
| 9,472,699 B2 | 10/2016 | Kotter |
| 9,481,112 B2 | 11/2016 | Kobrin et al. |
| 9,645,504 B2 | 5/2017 | Kobrin |
| 9,722,420 B2 | 8/2017 | Teggatz et al. |
| 9,726,790 B2 | 8/2017 | Boyd et al. |
| 9,726,791 B2 | 8/2017 | Boyd et al. |
| 9,782,917 B2 | 10/2017 | Kobrin et al. |
| 9,786,718 B1 | 10/2017 | Boyd |
| 9,793,317 B1 | 10/2017 | Boyd et al. |
| 9,893,261 B1 | 2/2018 | Boyd et al. |
| 9,923,514 B1 | 3/2018 | Boyd et al. |
| 9,981,410 B2 | 5/2018 | Kobrin et al. |
| 10,014,461 B1 | 7/2018 | Boyd et al. |
| 10,056,538 B1 | 8/2018 | Boyd |
| 10,079,561 B1 | 9/2018 | Boyd |
| 10,096,648 B2 | 10/2018 | Boyd |
| 10,103,654 B2 | 10/2018 | Yun et al. |
| 10,109,672 B2 | 10/2018 | Boyd et al. |
| 10,109,781 B1 | 10/2018 | Boyd |
| 10,110,163 B2 | 10/2018 | Boyd et al. |
| 10,247,861 B2 | 4/2019 | Boyd et al. |
| 10,249,810 B2 | 4/2019 | Boyd et al. |
| 10,345,491 B2 | 7/2019 | Boyd et al. |
| 10,345,492 B2 | 7/2019 | Boyd et al. |
| 10,347,777 B2 | 7/2019 | Boyd et al. |
| 10,525,684 B2 | 1/2020 | Boyd et al. |
| 10,529,871 B2 | 1/2020 | Boyd et al. |
| 10,546,991 B2 | 1/2020 | Boyd |
| 10,553,774 B2 | 2/2020 | Boyd |
| 10,690,485 B2 | 6/2020 | Koester et al. |
| 10,859,480 B2 | 12/2020 | Koester et al. |
| 10,985,677 B2 | 4/2021 | Boyd et al. |
| 11,101,421 B2 * | 8/2021 | Birmingham ........... H01L 35/04 |
| 2005/0016575 A1 | 1/2005 | Kumar et al. |
| 2005/0104185 A1 | 5/2005 | Shimogishi et al. |
| 2007/0182362 A1 | 8/2007 | Trainor et al. |
| 2010/0068406 A1 | 3/2010 | Man |
| 2010/0326487 A1 | 12/2010 | Komori et al. |
| 2011/0104546 A1 | 5/2011 | Seino et al. |
| 2011/0148248 A1 | 6/2011 | Landa |
| 2012/0153772 A1 | 6/2012 | Landa |
| 2013/0101729 A1 | 4/2013 | Keremes et al. |
| 2013/0313745 A1 | 11/2013 | Ikushima |
| 2015/0024516 A1 | 1/2015 | Seibel et al. |
| 2015/0087144 A1 | 3/2015 | Liu et al. |
| 2015/0229013 A1 | 8/2015 | Birmingham et al. |
| 2015/0251213 A1 | 9/2015 | Birmingham et al. |
| 2017/0106082 A1 | 4/2017 | Birmingham |
| 2017/0126150 A1 | 5/2017 | Wang |
| 2017/0155098 A1 | 6/2017 | Park et al. |
| 2017/0252807 A1 | 9/2017 | Lund et al. |
| 2017/0358432 A1 | 12/2017 | Wang |
| 2019/0214675 A1 | 7/2019 | Christensen et al. |
| 2019/0214845 A1 | 7/2019 | Hausman, Jr. et al. |
| 2019/0267846 A1 | 8/2019 | Shearer et al. |
| 2020/0153069 A1 | 5/2020 | Birmingham |
| 2020/0273959 A1 | 8/2020 | Birmingham |
| 2020/0274046 A1 | 8/2020 | Birmingham |
| 2020/0368848 A1 | 11/2020 | Birmingham |
| 2020/0369516 A1 | 11/2020 | Birmingham |
| 2020/0370158 A1 | 11/2020 | Birmingham |
| 2021/0086208 A1 | 3/2021 | Birmingham et al. |
| 2021/0091291 A1 | 3/2021 | Birmingham et al. |
| 2021/0091685 A1 | 3/2021 | Birmingham et al. |

FOREIGN PATENT DOCUMENTS

| | | |
|---|---|---|
| JP | 6147901 | 6/2017 |
| JP | 6411612 | 10/2018 |
| JP | 6411613 | 10/2018 |
| JP | 6521400 | 5/2019 |
| JP | 6521401 | 5/2019 |
| JP | 6524567 | 6/2019 |
| KR | 20180107194 | 10/2018 |
| WO | 2009004345 | 1/2009 |
| WO | 2014186783 | 11/2014 |
| WO | 2017214179 | 12/2017 |
| WO | 2020176344 | 9/2020 |
| WO | 2020176345 | 9/2020 |
| WO | 2020236776 | 11/2020 |
| WO | 2021061995 | 4/2021 |
| WO | 2021061996 | 4/2021 |
| WO | 2021061997 | 4/2021 |

(56) References Cited

OTHER PUBLICATIONS

Birmingham, J.G., "E-Field Micro-Injector Array Liquid Fuel Atomizer," Final Report for NASA SBIR Phase I: NASA 01.1-A8.02 (2002).
Brodie, I. et al., "Impregnated Barium Dispenser Cathodes Containing Strontium or Calcium Oxide," Journal of Applied Physics, vol. 27, pp. 417-418 (1956).
Brodie, I. et al., "Secondary electron emission from barium dispenser cathodes," British Journal of Applied Physics, vol. 8, pp. 202-204 (1957).
Chou, S.H. et al., "An orbital-overlap model for minimal work functions of cesiated metal surfaces," Journal of Physics Condensed Matter, vol. 24, p. 445007 (2012).
Committee On Thermionic Research and Technology et al., "Thermionics: Quo Vadis? An Assessment of the DTRA's Advanced Thermionics Research and Development Program," National Academy Press (2001).
Fall, C.J. et al., "Deriving accurate work functions from thin-slab calculations," Journal of Physics: Condensed Matter, vol. 11 2689-2696 (1999).
Fall, C.J. et al.," Theoretical maps of work-function anisotropies," Physical Review B, vol. 65, p. 045401 (2001).
Giordano, L. et al., "Tuning the surface metal work function by deposition of ultrathin oxide films: Density functional calculations," Physical Review B, vol. 73, p. 045414 (2005).
Gyftopoulos, E.P. et al, "Work Function Variation of Metals Coated by Metallic Films," Journal of Applied Physics, vol. 33, pp. 6-737 (1962).
Haas, G.A et al., "Interatomic Auger Analysis of the Oxidation of Thin Ba Films," Applications of Surface Science, vol. 16, pp. 139-162 (1983).
Hafner, J et al., "Toward Computational Materials Design: The Impact of Density Functional Theory on Materials Research," MRS Bulletin, vol. 31, pp. 659-668 (2006).
Houston, J.M., "Theoretical Efficiency of the Thermionic Energy Converter," Journal of Applied Physics, vol. 30, pp. 481-487 (1959).
Ncropera, F.P et al., "Fundamentals of Heat and Mass Transfer, 6th Edition," John Wiley & Sons, pp. 2-42 [2007].
Jensen, K.L et al., "A photoemission model for low work function coated metal surfaces and its experimental validation," Journal of Applied Physics, vol. 99, p. 124905 (2006).
Kawano, H., "Effective work functions for ionic and electronic emissions from mono- and polycrystalline surfaces," Progress in Surface Science, vol. 83, pp. 1-165 (2008).
Lee, J.-H. et al, "Thermionic Emission From Microfabricated Silicon-Carbide Filaments," Proceedings Power MEMS, pp. 149-152 (2009).
Lenggoro, I.W. et al., "Nanoparticle Assembly on Patterned "plus/minus" Surfaces From Electrospray of Colloidal Dispersion," Journal of Colloid and Interface Science, vol. 303, pp. 124-130 (2006).
Levine, J.D., "Structural and Electronic Model of Negative Electron Affinity on The Si/Cs/O Surface," Surface Science, vol. 34, pp. 90-107 (1973).
Lin, M.C. et al., "Work functions of cathode surfaces with adsorbed atoms based on ab initio calculations," Journal of Vacuum Science and Technology B, vol. 26, pp. 821-825 (2008).
Lindell, L. et al., "Transparent, Plastic, Low-Work-Function Poly (3,4-ethylenedioxythiophene) Electrodes," Chemistry of Materials, vol. 18, pp. 4246-4252 (2006).
Love, J.C. et al., "Self-Assembled Monolayers of Thiolates on Metals as a Form of Nanotechnology," Chemical Reviews, vol. 105, pp. 1103-1169 (2005).
Maboudian, R. et al., "Critical Review: Adhesion in surface micromechanical structures," Journal of Vacuum Science and Technology B, vol. 15, pp. 1-20 (1997).
Maboudian, R. et al., "Self-assembled monolayers as anti-stiction coatings for MEMS: characteristics and recent developments," Sensors and Actuators, vol. 82, pp. 219-223 (2000).

Maboudian, R., "Surface processes in MEMS technology," Surface Science Reports, vol. 30, 207-269 (1998).
Magkoev, T.T. et al., "Aluminium oxide ultrathin-film growth on the Mo(110) surface: a work-function strudy," Journal of Physics: Condensed Matter, vol. 13, pages L655-L661 (2001).
Modinos, A., "Theory of Thermionic Emission," Surface Science, vol. 115, pp. 469-500 (1982).
Musho, T.D. et al., "Quantum simulation of thermionic emission from diamond films," Journal of Vacuum Science and Technology B, vol. 31, p. 021401 (2013).
Natan, A. et al., "Computing surface dipoles and potentials of self-assembled monolayers from first principles," Applied Surface Science, vol. 252, pp. 7608-7613 (2006).
Neugebauer, J. et al., "Adsorbate-substrate and adsorbate-adsorbate interactions of Na and K adlayers on Al (111)," Physical Review B, vol. 46, pp. 16067-16080 (1992).
Nichols, M.H., "The Thermionic Constants of Tungsten as a Function of Crystallographic Direction," Physical Review, vol. 57, pp. 297-306 (1940).
Prada, S. et al., "Work function changes induced by deposition of ultrathin dielectric films on metals: A theoretical analysis," Physical Review B, vol. 78, p. 235423 (2008).
Schwede, J.W. et al., "Photon-enhanced thermionic emission for solar concentrator systems," Nature Materials, vol. 9, p. 762-767 (2010).
Singh-Miller, N.E. et al., "Surface energies, work functions, and surface relaxations of low-index metallic surfaces from first principles," Physical Review B, vol. 80, p. 235407 (2009).
Vlahos, V. et al., "Ab initio investigation of barium-scandium-oxygen coatings on tungsten for electron emitting cathodes," Physical Review B, vol. 81, p. 054207 (2010).
Wang, C.S., "High photoemission efficiency of submonolayer cesium-covered surfaces," Journal of Applied Physics, vol. 48, pp. 1477-1479 (1977).
Wooten, L.A. et al., "Evaporation of Barium and Strontium from Oxide-Coated Cathodes," Journal of Applied Physics, vol. 26, pp. 44-51 (1955).
Zhao, Y.P., "Morphological stability of epitaxial thin elastic films by van der Waals force," Archive of Applied Mechanics, vol. 72, pp. 77-84 (2002).
International Search Report for PCT/US2020/033528, dated Aug. 2020.
Prieto Rojas, J. et al., "Folding and Stretching a Thermoelectric Generator," Proceedings of the Society of Photo-Dptical Instrumentation Engineers, vol. 10639, p. 10639E (2018).
International Search Report for PCT/US2020/052506, dated Dec. 2020.
International Search Report for PCT/US2020/052507, dated Dec. 2020.
International Search Report for PCT/US2020/052508, dated Dec. 2020.
Office Action for U.S. Appl. No. 16/284,979, dated Sep. 2020.
Office Action for U.S. Appl. No. 16/416,849, dated Nov. 2020.
International Search Report for PCT/US2020/019230, dated Jun. 2020.
International Search Report for PCT/US2020/019232, dated Jun. 2020.
Go, David B. et al., "Thermionic Energy Conversion in the Twenty-first Century: Advances and Opportunities for Space and Terrestrial Applications," Frontiers in Mechanical Engineering, vol. 3 (2017).
List of Birmingham Technologies, Inc. Patents or Applications Treated as Related, May 2020.
Chung, M.S. et al., "Energy exchange processes in electron emission at high fields and temperatures," Journal of Vacuum Science and Technology B, vol. 12, pp. 727-736 (1994).
Cutler, P.H. et al., "A new model for the replacement process in electron emission at high fields and temperatures," Applied Surface Science, vol. 76-77, pp. 1-6 (1994).
De Juan, L. et al., "Charge and size distribution of electrospray drops," Journal of Colloid Interface Science, vol. 186, No. 2, pp. 280-293 (1997).

(56) References Cited

OTHER PUBLICATIONS

Dillner, U., "The effect of thermotunneling on the thermoelectric figure of merit," Energy Conversion and Management, vol. 49, No. 12, pp. 3409-3425 (2008).
Fernandez De La Mora, J. et al., "Generation of submicron monodisperse aerosols by electrosprays," Journal of Aerosol Science, vol. 21, Supplement 1, pages S673-S676 (1990).
Hishinuma, Y et al., "Refrigeration by combined tunneling and thermionic emission in vacuum: use of nanometer scale design," Applied Physics Letters, vol. 78, No. 17, pp. 2572-2574 (2001).
Hishinuma, Yoshikazu et al., "Measurements of cooling by room-temperature thermionic emission across a nanometer gap," Journal of Applied Physics, vol. 94, No. 7, p. 4690 (2003).
Mahan, G.D., "Thermionic refrigeration," Journal of Applied Physics, vol. 76, No. 7, pp. 4362-4366 (1994).
Murray, Royce W., "Nanoelectrochemistry: Metal Nanoparticles, Nanoelectrodes, and Nanopores," Chemical Reviews, vol. 108, No. 7, pp. 2688-2720 (2008).
Nguyen, Hoang M. et al., "Thermionic emission via a nanofluid for direct electrification from low-grade heat energy," Nano Energy, vol. 49, pp. 172-178 (2018).
Scheible, Dominik V. et al., "Tunable coupled nanomechanical resonators for single-electron transport," New Journal of Physics, vol. 4, pp. 86.1-86.7 (2002).
Snider, D.R. et al., "Variational calculation of the work function for small metal spheres," Solid State Communications, vol. 47, No. 10, pp. 845-849 (1983).
Sodha, M.S. et al., "Dependence of Fermi energy on size," Journal of Physics D: Applied Physics, vol. 3, No. 2, pp. 139-144 (1970).
Templeton, Allen C. et al., "Monolayer-Protected Cluster Molecules," Accounts of Chemical Research, vol. 33, No. 1, pp. 27-36 (2000).
Weiss, C. et al., "Accuracy of a mechanical single-electron shuttle," Europhysics Letters, vol. 47, No. 1, p. 97 (1999).
Ioffe, A.F., "Semiconductor Thermoelements and Thermoelectric Cooling Infosearch," Infosearch Ltd., 1957.
Bell, Lon E., "Cooling, heating, generating power, and recovering waste heat with thermoelectric systems," Science, vol. 321, pp. 1457-1461 (2008).
Bhadrachalam, Pradeep et al., "Energy-filtered cold electron transport at room temperature," Nature Communications, Sep. 10, 2014.
Brezonik, Patrick L. et al., "Water Chemistry: An Introduction to the Chemistry of Natural and Engineered Aquatic Systems," Oxford University Press, Inc., pp. 170-175 (2011).
Cronin, J.L., "Modern dispenser cathodes," IEE Proc., vol. 128, Pt. 1, No. 1, pp. 19-32 (1981).
Curzon, F.L. et al., "Efficiency of a Carnot engine at maximum power output," American Journal of Physics, vol. 43, pp. 22-24 (1975).
Daniel, Marie-Christine et al., "Gold Nanoparticles: Assembly, Supramolecular Chemistry, Quantum-Size-Related Properties, and Applications toward Biology, Catalysis, and Nanotechnology," Chemical Reviews, vol. 104, No. 1, pp. 293-346 (2004).
Deng, Weiwei et al., "Influence of space charge on the scale-up of multiplexed electrosprays," Aerosol Science 38, pp. 1062-1078 (2007).
Deng et al., "Digital electrospray for controlled deposition," Review of Scientific Instruments, vol. 81, pp. 035114-1-035114-6 (2010).
Fisher, T.S. et al.,"Thermal and Electrical Energy Transport and Conversion in Nanoscale Electron Field Emission Processes," Journal of Heat Transfer, vol. 124, pp. 954-962 (2002).
Fu, Xinyong et al., "Realization of Maxwell's Hypothesis," Shanghai Jiao Tong University (2008).
Klimeck et al., "Quantum device simulation with a generalized tunneling formula," Appl. Phys. Lett., vol. 67, pp. 2539-2541 (1995).
Koeck, Franz A.M. et al., "Thermionic electron emission from low work-function phosphorus doped diamond films," Diamond Related Material, vol. 18, pp. 789-791 (2009).
Landauer, R., "Spatial Variation of Currents and Fields Due to Localized Scatterers in Metallic Conduction," IBM Journal of Research and Development, vol. 1, pp. 223-231 (1957).
Likharev, Konstantin K., "Single-Electron Devices and Their Applications," Proc. IEEE, vol. 87, pp. 606-632 (1999).
Marzari, Nicola et al., "Maximally localized generalized Wannier functions for composite energy bands," Physical Review B, vol. 56, No. 20, pp. 12847-12865 (1997).
Muller-Steinhagen, Hans et al., "Concentrating solar power," Ingenia, pp. 1-9 (2004).
Obraztsov, Alexander et al., "Cold and Laser Stimulated Electron Emission from Nanocarbons," Journal Nanoelectronics and Optoelectronics, vol. 4, pp. 1-13 (2009).
Redko, Mikhail et al., "Design and Synthesis of a Thermally Stable Organic Electride," J. Am. Chem. Soc., vol. 127, No. 35, pp. 12416-12422 (2005).
Rusu, Paul et al., "Work functions of self-assembled monolayers on metal surfaces by first-principles calculations," Physical Review B, vol. 74, pp. 073414-1-073414-4 (2006).
Schreiber, Frank, "Structure and growth of self-assembling monolayers," Progress in Surface Science, vol. 65, pp. 151-256 (2000).
Shakouri, Ali, "Nanoscale Thermal Transport and Microrefrigerators on a Chip," Proceedings of the IEEE, vol. 94, No. 8, pp. 1613-1638 (2006).
Shockley, William et al., "Detailed Balance Limit of Efficiency of pn Junction Solar Cells," Journal of Applied Physics, vol. 32, pp. 510-519 (1961).
Stephanos, Cyril, "Thermoelectronic Power Generation from Solar Radiation and Heat," University of Augsburg, Ph. D. Thesis, Nov. 2012.
Snyder, G. et al., "Complex thermoelectric materials," Nature Materials, vol. 7, pp. 105-114 (2008).
Taylor, Geoffrey, "Disintegration of water drops in an electric field," Proc. R. Soc. A, vol. 280, pp. 383-397 (1964).
Tepper, Gary et al., "An electrospray-based, ozone-free air purification technology," Journal of Applied Physics, vol. 102, pp. 113305-1-113305-6 (2007).
Thygesen, Kristian S. et al., "Partly occupied Wannier functions," Physical Review Letters, vol. 94, pp. 026405-1-026405-4 (2005).
Ulrich, Marc D. et al., "Comparison of solid-state thermionic refrigeration with thermoelectric refrigeration," Journal of Applied Physics, vol. 90, No. 3, pp. 1625-1631 (2001).
Wada, Motoi et al., "Effective Work Function of an Oxide Cathode in Plasma," J. Plasma Fusion Res. Series, vol. 8, pp. 1366-1369 (2009).
Watanabe, Satoru et al., "Secondary electron emission and glow discharge properties of 12CaO—7Al2O3 electride for fluorescent lamp applications," Science and Technology of Advanced Materials, vol. 12, pp. 1-8 (2011).
Weaver, Stan et al., "Thermotunneling Based Cooling Systems for High Efficiency Buildings," GE Global Research, DOE Project: DE-FC26-04NT42324 (2007).
Yamamoto, Shigehiko, "Fundamental physics of vacuum electron sources," Reports on Progress in Physics, vol. 69, pp. 181-232 (2006).
Zharin, Anatoly L. et al., "Application of the contact potential difference technique for on-line rubbing surface monitoring (review)," Tribology Letters, vol. 4, pp. 205-213 (1998).
Zhu, Moxuan, "Experimental Measurements of Thermoelectric Phenomena in Nanoparticle Liquid Suspensions (Nanofluids)," Graduate Thesis, Arizona State University, Dec. 2010.
Alhuwaidi, S.A., "3D Modeling Analysis, and Design of a Traveling-Wave Tube Using a Modified Ring-Bar Structure with Rectangular Transmission Lines Geometry," Dissertation submitted to the University of Colorado Colorado Springs (2017).
Datta, S., "Electronic Transport in Mesoscopic Systems," Cambridge University Press, New York, pp. 246-275 (1995).
Fomenko, V.S., "Handbook of Thermionic Properties, Electronic Work Functions and Richardson Constants of Elements and Compounds," Plenum Press Data Division, New York, pp. 126-137 (1966).

(56) References Cited

OTHER PUBLICATIONS

Hatsopoulos, G.N. et al., "Thermionic Energy Conversion vol. I: Process and Devices," The MIT Press, Cambridge, MA, pp. 5-37 (1973).
Morris, J.E., "Nanopackaging: Nanotechnologies and Electronics Packaging," Springer-Verlag, pp. 93-107 (2008).
Birmingham, Joseph, "Printed Self-Powered Miniature Air Sampling Sensors," Sensors and Transducers, vol. 214, pp. 1-11 (2017).
Murata, Kazuhiro, "Super-fine ink-jet printing for nanotechnology," Proceedings International Conference on MEMS, NANO and Smart Systems, pp. 346-349 (2003).
Office Action for U.S. Appl. No. 16/284,967, dated Jul. 2020.
Park, Jang-Ung et al., ""High-resolution electrohydrodynamic jet printing,"" Nature Materials, vol. 6, pp. 782-789 (2007).
Park, Jang-Ung et al., "Nanoscale Patterns of Oligonucleotides Formed by Electrohydrodynamic Jet Printing with Applications in Biosensing and Nanomaterials Assembly," Nano Letters, vol. 8, pp. 4210-4216 (2008).
Schneider, Julian, "Electrohydrodynamic nanoprinting and its applications," Diss. ETH No. 22694 (2015).
Baram, M. et al., "Nanometer-Thick Equilibrium Films: The Interface Between Thermodynamics and Atomistics," Science, vol. 332, Issue 6026, pp. 206-209 (2011).
Bassani, J.L., "Incompatibility and a simple gradient theory of plasticity," Journal of Mechanics and Physics of Solids vol. 49, pp. 1983-1996 (2001).
Battezzati, L. et al., "Solid state reactions in Al/Ni alternate foils induced by cold rolling and annealing," Acta Materialia, vol. 47, Issue 6, pp. 1901-1914 (1999).
Darling, K.A. et al., "Thermal stability of nanocrystalline Fe—Zr alloys," Materials Science and Engineering A, vol. 527, pp. 3572-3580 (2010).
Detor, Andrew J. et al., "Grain boundary segregation, chemical ordering and stability of nanocrystalline alloys Atomistic computer simulations in the Ni—W system," Acta Materialia, vol. 55, pp. 4221-4232 (2007).
Dinda, G.P. et al., "Synthesis of bulk nanostructured Ni, Ti and Zr by repeated cold-rolling," Scripta Materialia, vol. 52, Issue 7, pp. 577-582 (2005).
Gertsman, V. Y. et al., "Deformation behavior of ultrafine-grained materials," Materials Science Forum, vols. 225-227, pp. 739-744 (1996).
Gudmundson, Peter, "A unified treatment of strain gradient plasticity," Journal of the Mechanics and Physics of Solids, vol. 52, pp. 1379-1406 (2004).
Hentschel, T. et al., "Nanocrytsalline Ni-3.6 at.% P and its Transformation Sequence Studied by Atom-Probe Field-Ion Microscopy," Acta Materialia, vol. 48, pp. 933-941 (2000).
Jaworek, A., "Electrospray droplet sources for thin film deposition," Journal of Materials Science, vol. 42, Issue 1, pp. 266-297 (2007).
Kirchheim, Reiner, "Grain coarsening inhibited by solute segregation," Acta Materialia, vol. 50, pp. 413-419 (2002).
Kirchheim, Reiner, "Reducing grain boundary, dislocation line and vacancy formation energies by solute segregation II. Experimental evidence and consequences," Acta Materialia, vol. 55, pp. 5139-5148 (2007).
Kirchheim, Reiner, "Reducing grain boundary, dislocation line and vacancy formation energies by solute segregation. I. Theoretical backround," Acta Materialia, vol. 55, pp. 5129-5138 (2007).
Koch, C.C. et al., "Stabilization of nanocrystalline grain sizes by solute additions," Journal of Materials Science, vol. 43, Issue 23-24, pp. 7264-7272 (2008).
Koch, C.C. et al., "Ductility of Nanostructured Materials," Materials Research Society Bulletin, vol. 24, pp. 54-58 (1999).
Koch, C.C., "Synthesis of nanostructured materials by mechanical milling: problems and opportunities," Nanostructured Materials, vol. 9, Issues 1-8, pp. 13-22 (1997).
Lee, Z. et al., "Bimodal microstructure and deformation of cryomilled bulk nanocrystalline Al-7.5Mg alloy," Materials Science and Engineering A, vols. 410-411, pp. 462-467 (2005).
Legros, M et al., "Microsample tensile testing of nanocrystalline metals," Philosophical Magazine A, vol. 80, No. 4, pp. 1017-1026 (2000).
Lloyd, D.J., "Particle reinforced aluminum and magnesium matrix composites," International Materials Reviews, vol. 39, Issue 1, pp. 1-23 (1994).
Luo, Jian et al., "The Role of a Bilayer Interfacial Phase on Liquid Metal Embrittlement," Science, vol. 333, Issue 6050, pp. 1730-1733 (2011).
Mayr, S.G. et al., "Stabilization of Cu nanostructures by grain boundary doping with Bi: Experiment versus molecular dynamics simulation," Physical Review B, vol. 76, p. 024111 (2007).
Mccandlish L.E. et al., "Chemical processing of nanophase WC-Co composite powders," Materials Science and Technology, vol. 6, Issue 10, pp. 953-957 (1990).
Millett, Paul C. et al., "Stabilizing nanocrystalline materials with dopants," Acta Materialia, vol. 55, pp. 2329-2336 (2007).
Moon, Kyoung II et al., "A study of the microstructure of nanocrystalline Al—Ti alloys synthesized by ball milling in a hydrogen atmosphere and hot extrusion," Journal of Alloys Compounds, vol. 291, pp. 312-321 (1999).
Mortensen, A. et al., "Metal Matrix Composites," Annual Review of Materials Research, vol. 40, pp. 243-270 (2010).
Nabarro, F.R.N., "The theory of solution hardening," The Philosophical Magazine: A Journal of Theoretical Experimental and Applied Physics, vol. 35, pp. 613-622 (1977).
Nan, C.W. et al., "The Influence of Particle Size and Particle Fracture on the Elastic/Plastic Deformation of Metal Matrix Composites," Acta Materialia, vol. 44, No. 9, pp. 3801-3811 (1996).
Perepezko, J.H., et al., "Amorphization and nanostructure synthesis in Al alloys", Intermetallics 10 (2002) p. 1079-1088.
Sanders, P.G. et al., "Elastic and Tensile Behavior of Nanocrystalline Copper and Palladium," Acta Materialia, vol. 45, No. 10, pp. 4019-4025 (1997).
Sanders, P.G. et al., "The strength of nanocrystalline metals with and without flaws," Materials Science Engineering A, vol. 234-236, pp. 77-82 (1997).
Scoville, N. et al., "Thermal Conductivity Reductions in SiGe Via Addition of Nanophase Particles," Materials Research Society Symposium Proceedings, vol. 351, pp. 431-436 (1994).
Sekine, H. et al., "A combined microstructure strengthening analysis of SiC—p/Al metal matrix composites," Composites, vol. 26, pp. 183-188 (1995).
Tsuji, N. et al., "Strength and ductility of ultrafine grained aluminum and iron produced by ARB and annealing," Scripta Materialia, vol. 47, pp. 893-899 (2002).
Valiev, R. Z. et al., "Bulk nanostructured materials from severe plastic deformation," Progress in Materials Science, vol. 45, pp. 103-189 (2000).
Valiev, R.Z. et al., "Producing Bulk Ultrafine-Grained Materials by Severe Plastic Deformation," Journal of Materials, vol. 58, Issue 4, p. 33 (2006).
Valiev, R.Z. et al., "Paradox of strength and ductility in metals processed by severe plastic deformation," Journal of Materials Research, vol. 17, No. 1, pp. 5-8 (2002).
Vanherpe, L. et al., "Pinning effect of spheroid second-phase particles on grain growth studied by three-dimensional phase-field simulations", Computational Materials Science 49 (2010) 340-350.
Wang, Y. et al.,"High tensile ductility in a nanostructured metal", Nature, 419 (2002), 912-915.
Wang, Y. M. et al., "Enhanced tensile ductility and toughness in nanostructured Cu," Applied Physics Letters, vol. 80, pp. 2395-2397 (2002).
Weertman, J.R. et al., "Structure and Mechanical Behavior of Bulk Nanocrystalline Materials," Materials Research Society Bulletin, vol. 24, pp. 44-50 (1999).
Weissmuller, J., "Alloy Effects in Nanostructures" Nanostructured Materials, vol. 3, pp. 261-272 (1993).
Xiao, T.D. et al., "Synthesis of Nanostructured Ni/Cr and Ni—Cr3C2 Powders by an Organic Solution Reaction Method," Nanostructured Materials, vol. 7, No. 8, pp. 857-871 (1996).

(56) References Cited

OTHER PUBLICATIONS

Xiao, T.D. et al., "Synthesis of Si(N,C) nanostructured powders from an organometallic aerosol using a hot-wall Yeactor," Journal of Materials Science, vol. 28, pp. 1334-1340 (1993).

Yamasaki, T. et al., "Formation of metal-TiN/TiC nanocomposite powders by mechanical alloying and their consolidation," Materials Science and Engineering A, vol. 350, pp. 168-172 (2003).

Olawole, O.C. et al., "Theoretical studies of thermionic conversion of solar energy with graphene as emitter and collector," Journal of Photonics for Energy, vol. 8(1), p. 018001 (2018).

Sindhuja, M. et al., "High Efficiency Graphene Coated Copper Based Thermocells Connected in Series," Frontiers in Physics, vol. 6, Article 35 (2018).

Office Action for U.S. Appl. No. 16/582,545, dated Jun. 7, 2021.

\* cited by examiner

Table of Elemental Work Function Values of Bulk Materials

| Element | φ (eV) | Element | φ (eV) | Element | φ (eV) |
|---|---|---|---|---|---|
| Cs | 2.14 | As | 3.75 | Fe | 4.5 |
| Rb | 2.26 | Tl | 3.84 | Sb | 4.55 |
| K | 2.30 | Hf | 3.9 | W | 4.55 |
| Eu | 2.50 | Zr | 4.05 | Mo | 4.6 |
| Sr | 2.59 | Mn | 4.1 | Cu | 4.65 |
| Ba | 2.7 | In | 4.12 | Ru | 4.71 |
| Sm | 2.7 | Ga | 4.2 | Os | 4.83-5.93 |
| Na | 2.75 | Bi | 4.22 | Si | 4.85 |
| Ca | 2.87 | Cd | 4.22 | Te | 4.95 |
| Ce | 2.9 | Pb | 4.25 | Re | 4.96 |
| Li | 2.93 | Ta | 4.25 | Be | 4.98 |
| Tb | 3.0 | Ag | 4.26 | Rh | 4.98 |
| Gd | 3.1 | Al | 4.28 | C | 5.0 |
| Y | 3.1 | Nb | 4.3 | Co | 5.0 |
| Nd | 3.2 | V | 4.3 | Ge | 5.0 |
| Lu | 3.3 | Ti | 4.33 | Au | 5.1 |
| Th | 3.4 | Zn | 4.33 | Pd | 5.12 |
| La | 3.5 | Sn | 4.42 | Ni | 5.15 |
| Sc | 3.5 | B | 4.45 | Ir | 5.27 |
| U | 3.63 | Hg | 4.49 | Pt | 5.65 |
| Mg | 3.66 | Cr | 4.5 | Se | 5.9 |

METHOD OF MANUFACTURING AND OPERATING NANO-SCALE ENERGY CONVERSION DEVICE

BACKGROUND

The present embodiments relate to electric power generation, conversion, and transfer. More specifically, the embodiments disclosed herein are related to a method of manufacturing and operating nano-scale energy conversion devices that generate electric power through thermionic energy conversion and thermoelectric energy conversion.

Portable electric power generating devices are often used to power devices where access to electric power from the electric power grid is not practical (e.g., mobile phones and tablets in a shopping complex and satellites in orbit about the Earth). Such devices are also used when access to the grid is not possible (e.g., remote installations with intermittent or no grid availability). In addition, such devices are used as a backup power supply to support continued operation of critical equipment during a grid event (e.g., a blackout or a brownout).

Standard, portable electric power generation devices include gasoline engines and diesel engines. However, when in operation, these devices require frequent monitoring to ensure that necessary refueling is performed to maintain the devices in operation. Photoelectric devices, e.g., solar cells are effective only when sufficient light is available. Commercially available electric power storage devices include, for example, electrochemical batteries and solid state batteries. However, due to limited charges on electrochemical and solid state batteries, frequent replacement and/or recharging are required. In addition, electrochemical batteries and solid state batteries have a relatively large footprint when used for emergency and backup power supplies in industrial facilities. Similarly, microelectronic devices are not always compatible with the employment of electrochemical batteries and solid state batteries. One example of a microelectronic device possibly requiring a compact, long-life, low-current, electric power device is a low power electronic sensor which is installed for long-term unattended operation in an inaccessible location. Another example of a microelectronic device possibly requiring a compact, long-life, minimal power draw, is a nonvolatile memory circuit of a compact computing device.

Other portable power generation devices include fuel cells and nuclear batteries. Fuels cells require hydrogen replacement after a period of time and, similar to electrochemical and solid state batteries, fuel cells have a relatively large footprint when used as emergency and backup power supplies in industrial facilities. Nuclear batteries rely on processes that include fission, fusion, or radioactive decay of the nuclei of atoms. These processes are relatively inefficient and require shielding to reduce the emissions of ionizing radiation that are a natural by-product of the nuclear processes.

SUMMARY

Methods are provided to manufacture an electric power generator and generate electric power on a nanometer scale.

In one aspect, a method of manufacturing an electric power generator is provided. The method includes fabricating first and second electrodes. Fabrication of the first electrode includes applying a first material, such as tungsten (W) with a first work function value on a first substrate, and depositing a second material, such as cesium oxide ($Cs_2O$), over at least a portion of the first material. The fabrication changes the first electrode from the first work function value to a second work function value, with the second work function value being less than the first work function value. Fabrication of the second electrode includes applying a third material, such as gold (Au), with a third work function value on a second substrate. The fabrication includes depositing at least one fourth material, such as $Cs_2O$, different from the first and third materials, over at least a portion of the third material. The deposit of the fourth material creates a fourth work function value for the second electrode, with the fourth work function value being less than the third work function value. The second electrode is positioned at a separation distance from the first electrode, and a cavity is defined by the separation. A nanofluid is added to the cavity. The nanofluid includes a plurality of nanoparticles that have a nanoparticle work function value that is greater than the first and second work function values.

In another aspect, a method for generating electric power generator is provided. The method includes providing an emitter electrode with a first work function value and a collector electrode with a second work function value that is less than the first work function value. The emitter electrode is positioned a distance from the collector electrode. The distance is in a range between about 1 nanometer and less than about 10 nanometers. A contact potential difference is established between the first electrode and the second electrode. A plurality of nanoparticles is provided within a cavity defined by the distance positioning, with the nanoparticles having a third work function value greater than the first and second work function values. A plurality of electrons is emitted from the emitter electrode, and the emitted electrons are transmitted to the collector electrode through Brownian motion of the nanoparticles.

These and other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments, and not of all embodiments, unless otherwise explicitly indicated.

FIG. 4 depicts a table of elemental work function values of bulk materials.

DETAILED DESCRIPTION

Figure 1:
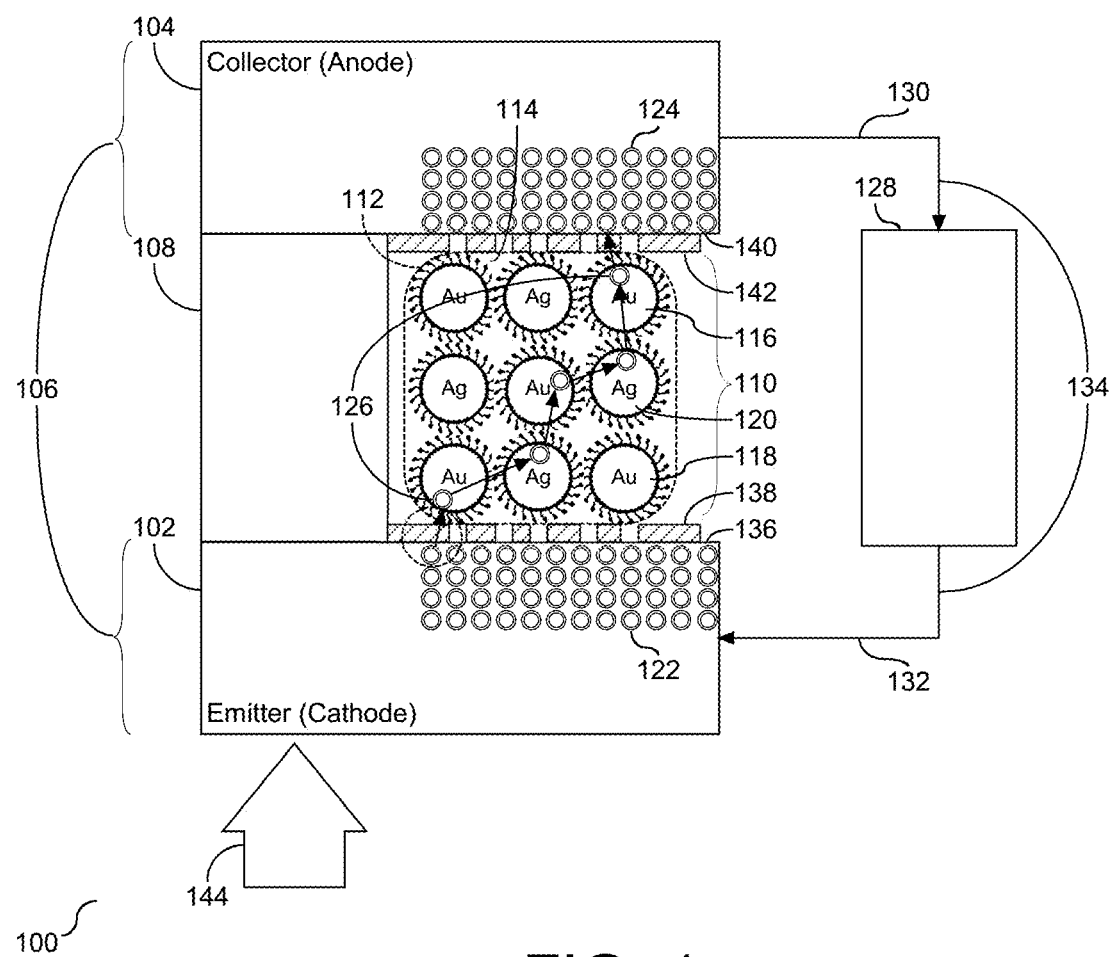
FIG. 1 depicts a cutaway view of one embodiment of a nano-scale energy conversion device.

It will be readily understood that the components of the present embodiments, as generally described and illustrated in the Figures herein, may be arranged and designed in a wide variety of different configurations. Thus, the following detailed description of the embodiments of the apparatus, system, and method of the present embodiments, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment. Thus, appearances of the phrases "a select embodiment," "in one embodiment," or "in an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Thermoelectric power conversion presents a way to harvest available waste heat and convert this thermal energy into electricity. Thermoelectric power generation requires the attachment of one electrode to a different electrode to form a junction therebetween where the two electrodes experience a temperature gradient. Based on the Seebeck effect, the temperature gradient induces a voltage. Higher temperature differentials tend to produce higher voltages and electric currents. However, due to the transfer of heat between the two materials at the junction, a thermal backflow is introduced which reduces the efficiency of thermoelectric power conversion systems. Some nuclear batteries (as described above) include the combination of technologies such as photovoltaic batteries and thermoelectric batteries. In the photovoltaic battery, nuclear radiation energy is first converted into electromagnetic radiation, typically by irradiating a phosphorescent material and then exposing a semiconductor p-n junction to electromagnetic radiation to produce low voltage electrical current in. In the thermoelectric battery, the nuclear radiation is converted into thermal energy that in turn is converted to electrical energy by means of thermoelectric conversion.

Thermionic power conversion also provides a method to convert heat into electrical energy. Thermoelectric power conversion generators convert heat energy to electrical energy by an emission of electrons from a heated emitter electrode (i.e., a cathode). Electrons flow from an emitter electrode, across an inter-electrode gap, to a collector electrode (i.e., an anode), through an external load, and return back to the emitter electrode, thereby converting heat to electrical energy. Recent improvements in thermionic power converters include selecting materials with lower work functions for the electrodes and using a fluid to fill the inter-electrode gap. The electron transfer density is limited by the materials of the electrodes and the materials of the fluid in the inter-electrode gap (i.e., the associated work functions).

Construction of the Nano-scale Energy Conversion Device

To provide additional details for an improved understanding of selected embodiments of the present disclosure, reference is now made FIG. 1 illustrating a cutaway view of one embodiment of a nano-scale energy conversion device (100) that is configured to generate electrical power. The nano-scale energy conversion device (100) is sometimes referred to as a cell or a layer. A plurality of devices (100) may be organized as a plurality of cells or a plurality of layers in series or parallel, or a combination of both to generate electrical power at the desired voltage, current, and power output. The nano-scale energy conversion device (100) includes an emitter electrode (cathode) (102) and a collector electrode (anode) (104). The emitter electrode (102) and collector electrode (104) are collectively referred to as the electrodes (106) of the nano-scale energy conversion device (100). A plurality of insulator posts, also referred to herein as columns, standoffs, or micro-pillars, (108) (only one shown) maintain separation between the electrodes (106) such that the electrodes (106) and the insulator posts (108) define a cavity (110). In one embodiment, the insulator posts (108) are fabricated with a dielectric material, such as, and without limitation, alkanethiol, sol-gel with aerogel-like properties, corona dope, super corona dope, silicon, silicon-oxide, polymer, or any dielectric material. In one embodiment, rather than insulator posts (108), one or more insulator walls (not shown) are formed that divide the cavity (110). The cavity (110) extends between the electrodes (106) for a distance in the range from 1 nanometer (nm) to less than about 10 nm. An interstitial nanofluid (112) is maintained within the cavity (110). Accordingly, nano-scale energy conversion device (100) includes two opposing electrodes (106) separated by insulator posts (108) with a cavity (110) filled with a nanofluid (112) between the electrodes (106).

The emitter electrode (102) and the collector electrode (104) are each fabricated with different materials, with the different materials having separate and different work function values. As used herein, the work function of a material (or a combination of materials) is the minimum thermodynamic work (i.e., minimum energy) needed to remove an electron from a solid to a point in a vacuum immediately outside a solid surface of the material. The work function is a material-dependent characteristic. Work function values are typically expressed in units of electron volts (eV). Accordingly, the work function of a material determines the minimum energy required for electrons to escape the surface, with lower work functions generally facilitating electron emission.

The emitter electrode (102) has a higher work function value than the collector electrode (104). The difference in work function values between the electrodes (106) due to the different electrode materials induces a contact potential difference between the electrodes (106) that has to be overcome to transmit electrons through the nanofluid (112) within the cavity (110) from the emitter electrode (102) to the collector electrode (104). Both electrodes (106) emit electrons, however, as explained in more detail elsewhere herein, once the contact potential difference is overcome, the emitter electrode (102) will emit significantly more electrons than the collector electrode (104). A net flow of electrons will be transferred from the emitter electrode (102) to the collector electrode (104), and a net electric current will flow from the emitter electrode (102) to the collector electrode (104). This net current causes the emitter electrode (102) to become positively charged and the collector electrode (104) to become negatively charged. Accordingly, the nano-scale energy conversion device (100) generates an electrical current that is transmitted from the emitter electrode (102) to the collector electrode (104).

The nanofluid (112) includes a dielectric medium (114) and a plurality of nanoparticle clusters (116) suspended in the dielectric medium (114). The nanofluid (112) minimizes ohmic heating and eliminates formation of space charges in the cavity (110) such that arcing in the medium (114) is prevented. In some embodiments, and without limitation, the dielectric medium (114) is one of water, silicone oil, or alcohol. Also, in at least one embodiment, the dielectric medium (114) is a sol-gel with aerogel-like properties and low thermal conductivity values that reduce heat transfer therethrough, e.g., thermal conductivity values less than 1.0 watts per meter-degrees Kelvin (W/m° K). In at least one embodiment, the thermal conductivity of the dielectric medium (114) is as low as 0.013 watts per meter-degrees Kelvin (W/m° K), as compared to the thermal conductivity of water at 20 degrees Celsius (° C.) of 0.6 W/m° K. Accordingly, the nanofluid (112) minimizes heat transfer through the cavity (110) with low thermal conductivity values. The heat transport in the thermal conductivity nanofluid (112) is proportional to the temperature difference between the electrodes (102) and (104). For example, if the heat transport in a low thermal conductivity nanofluid is small, a high temperature difference between the two electrodes (102 and 104) can be maintained during operation. As discussed elsewhere herein, the electrical conductivity of the nanofluid (112) changes with operation of the corresponding device.

The nanoparticle clusters (116) may be fabricated from metal and metal alloys, ceramics, cermet, composites, and other materials. Some of the nanoparticle clusters (116) may include materials dissimilar from other nanoparticle clusters (116). In one embodiment, and without limitation, the nanofluid (112) includes nanoparticle clusters (116) of gold (Au) (118) and silver (Ag) (120). As used herein, "nanoparticle clusters" refers to a grouping of 6 to 8 atoms of the associated materials, e.g., Au and Ag, where the number of atoms is non-limiting, The nanoparticle clusters (116) have work function values that are greater than the work function values for the electrodes (106). Specifically, the work function values of the Au nanoparticle clusters (118) and the Ag nanoparticle clusters (120) are 4.1 eV and 3.8 eV, respectively. As explained in more detail elsewhere herein, charge transport through electron hopping and Brownian motion is facilitated by the greater work function values of the nanoparticle clusters (116) and use of at least two types of nanoparticle clusters (116), each type with a different work function value. The Brownian motion of the nanoparticle clusters (116) includes collisions between the nanoparticle clusters (116) among themselves and collisions between the nanoparticle clusters (116) and the two electrodes (102) and (104).

The nanoparticle clusters (116) are coated with alkanethiol to form a dielectric barrier thereon, where the selection of alkanethiol is non-limiting. In at least one embodiment, dodecanethiols are used. In at least one other embodiment, at least one other alkane shorter than dodecanethiol and decanethiol is used. The length of the alkane chain is limited by the need for the nanoparticle conductive cores to be within 1 nm to transfer electrons from one conductive surface to another. The alkanethiol coating reduces coalescence of the nanoparticle clusters (116). In one embodiment, the nanoparticle clusters (116) have a diameter in the range of 0.5 nm to 5 nm. In at least one embodiment, the nanoparticle clusters (116) have a diameter in the range of 1-3 nm. In one embodiment, the nanoparticle clusters (116) have a diameter of 2 nm. The nanoparticle clusters (116) of Au (118) and Ag (120) are tailored to be electrically conductive with charge storage features. Accordingly, the nanofluid (112), including the suspended nanoparticle clusters (116), provides a conductive pathway for electrons to travel across the cavity (110) from the emitter electrode (102) to the collector electrode (104) through charge transfer.

A plurality of emitter electrons (122) and a plurality of collector electrons (124) are shown proximate to the cavity (110) within the respective emitter electrode (102) and collector electrode (104). An electron (126) is shown as leaving the emitter electrode (102), hopping across the nanoparticle clusters (116), and entering the collector electrode (104). FIG. 1 illustrates an external circuit (128) connected to the two electrodes (106). Specifically, a first electrical conductor (130) is connected to the collector electrode (104) and the external circuit (128) and a second electrical conductor (132) is connected to the external circuit (128) and the emitter electrode (102). When nano-scale energy conversion device (100) is in service generating electricity, external circuit current (134) is transmitted through external circuit (128), and the same amount of electron current as flowing through the external circuit (134) will flow from the emitter electrode (102) to the collector electrode (104). For example, a single cell or layer, such as the configuration shown and described in FIG. 1, can generate a voltage within a range extending between about 0.25 volts and 6.0 volts, depending on the contact potential difference (discussed further herein) induced between the emitter electrode (102) and the collector electrode (104) as a function of the materials used for each. In some embodiments, the device (100) nominally generates between about 0.75 volts and 5.0 volts. In one embodiment, the device generates about 0.75 volts. Also, for example, a single cell or layer, such as the configuration shown and described in FIG. 1, the device (100) can generate an electrical current within a range of approximately 1 millimpere (ma) to approximately 10 ma. Further, in some embodiments, the device (100) generates approximately 0.75 milliwatts per square centimeter (mW/cm$^2$). Accordingly, nano-scale energy conversion device (100) generates sufficient electrical current to power small loads, e.g., a micro-circuit.

The emitter electrode (102) is manufactured with a tungsten (W) nanoparticle surface (136) and a cesium oxide ($Cs_2O$) coating (138) that at least partially covers the W nanoparticle surface (136). The collector electrode (104) is manufactured with a gold (Au) nanoparticle surface (140) and a $Cs_2O$ coating (142) that at least partially covers the Au nanoparticle surface (140). As discussed further herein, during manufacturing of the electrodes (106), W nanoparticles are electrosprayed onto one side of polymer base that includes a graphene film, i.e., an atomic-scale lattice of carbon atoms, on one side of the polymer base. The W nanoparticles form a surface layer on the graphene film. The $Cs_2O$ coating (138) on the W nanoparticle surface (136) is layered on the surface (136) through a template. The polymer base is a sacrificial component for assembly that is removed with acetone (described further herein). Similarly, the Au nanoparticles are electrosprayed onto the graphene film on a polymer base to form the Au nanoparticle surface (140) and the $Cs_2O$ coating (142) is layered on the Au nanoparticle surface (140) through a template, and the polymer base is removed. The use of the templates with particular electrospray and nanofabrication techniques form deposited layers of $Cs_2O$ (138) and (142) in one or more predetermined patterns on the W nanoparticle surface (136) and the Au nanoparticle surface (140). A percentage of coverage of each of the two substrates (136) and (140) with the respective $Cs_2O$ coating layers (138) and (142) is within a range of at least 50% up to 70%, and in at least one embodiment, is about 60%. The $Cs_2O$ coatings (138) and (142) reduce the work function values of the electrodes (102) and (104) from the work function values of W (typically 4.55 eV) and Au (typically 5.1 eV), respectively. Specifically, the emitter electrode (102) has a work function value of 0.88 electron volts (eV) and the collector electrode (104) has a work function value of 0.65 eV. Accordingly, the lower work function values of the electrodes (102) and (104) are essential to the operation of the nano-scale energy conversion device (100) as described herein.

W and Au were selected for the electrodes (106) due to at least some of their metallic properties (e.g., strength and resistance to corrosion) and the measured change in work function when the thermionic emissive material of $Cs_2O$ is layered thereon. Alternative materials may be used, such as noble metals including, and without limitation, rhenium (Re), osmium (Os), ruthenium (Ru), tantalum (Ta), iridium (Jr), rhodium (Rh), palladium (Pd), and platinum (Pt), or any combination of these metals. In addition, and without limitation, non-noble metals such as aluminum (Al) and molybdenum (Mo) may also be used. For example, and without limitation, Al nanoparticles may be used rather than W nanoparticles to form surface (136), and Pt nanoparticles may be used rather than Au nanoparticles to form surface (140). Accordingly, the selection of the materials to use to form the nanoparticle surfaces (136) and (140) is principally based on the work functions of the electrodes (106), and more specifically, the difference in the work functions once the electrodes (106) are fully fabricated.

The nano-scale energy conversion device (100) generates electric power through harvesting heat energy (144). As described in further detail herein, the emitter electrode (102) receives the heat energy (144) from sources that include, without limitation, heat generating sources and ambient environments, and generates electrons (126) that traverse the cavity (110) via the nanoparticle clusters (116). The electrons (126) reach the collector electrode (104) and external circuit current (134) is transmitted to the external circuit (124). In some embodiments, nano-scale energy conversion device (100) generates electrical power through placement in ambient, room temperature environments. Accordingly, the nano-scale energy conversion device (100) harvests heat energy (144), including waste heat, to generate useful electrical power.

Assembly of the Nano-scale Energy Conversion Device

Figure 2A:
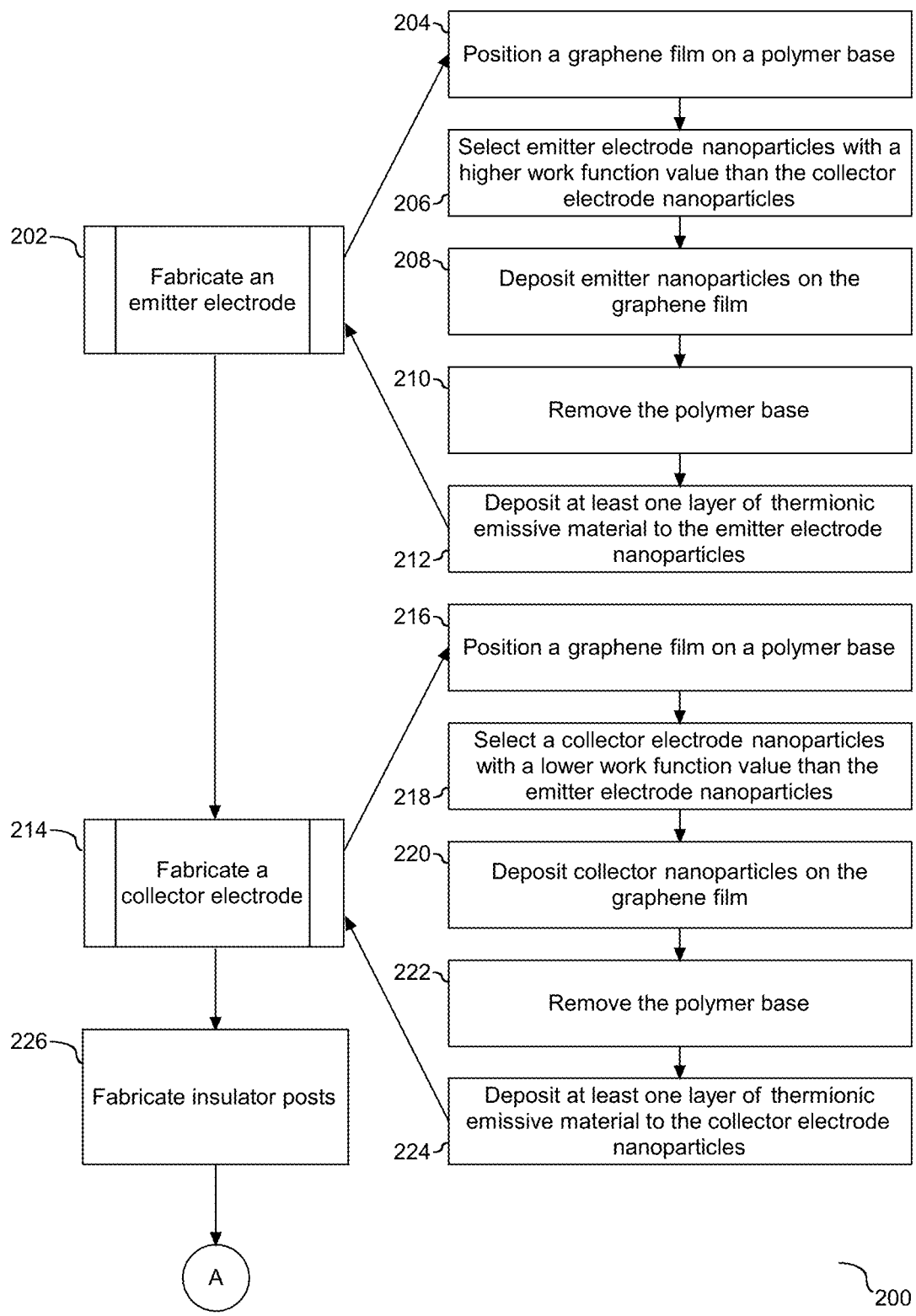
FIGS. 2A and 2B depict a flow chart illustrating a process for manufacturing a nano-scale energy conversion device.
Figure 2B:
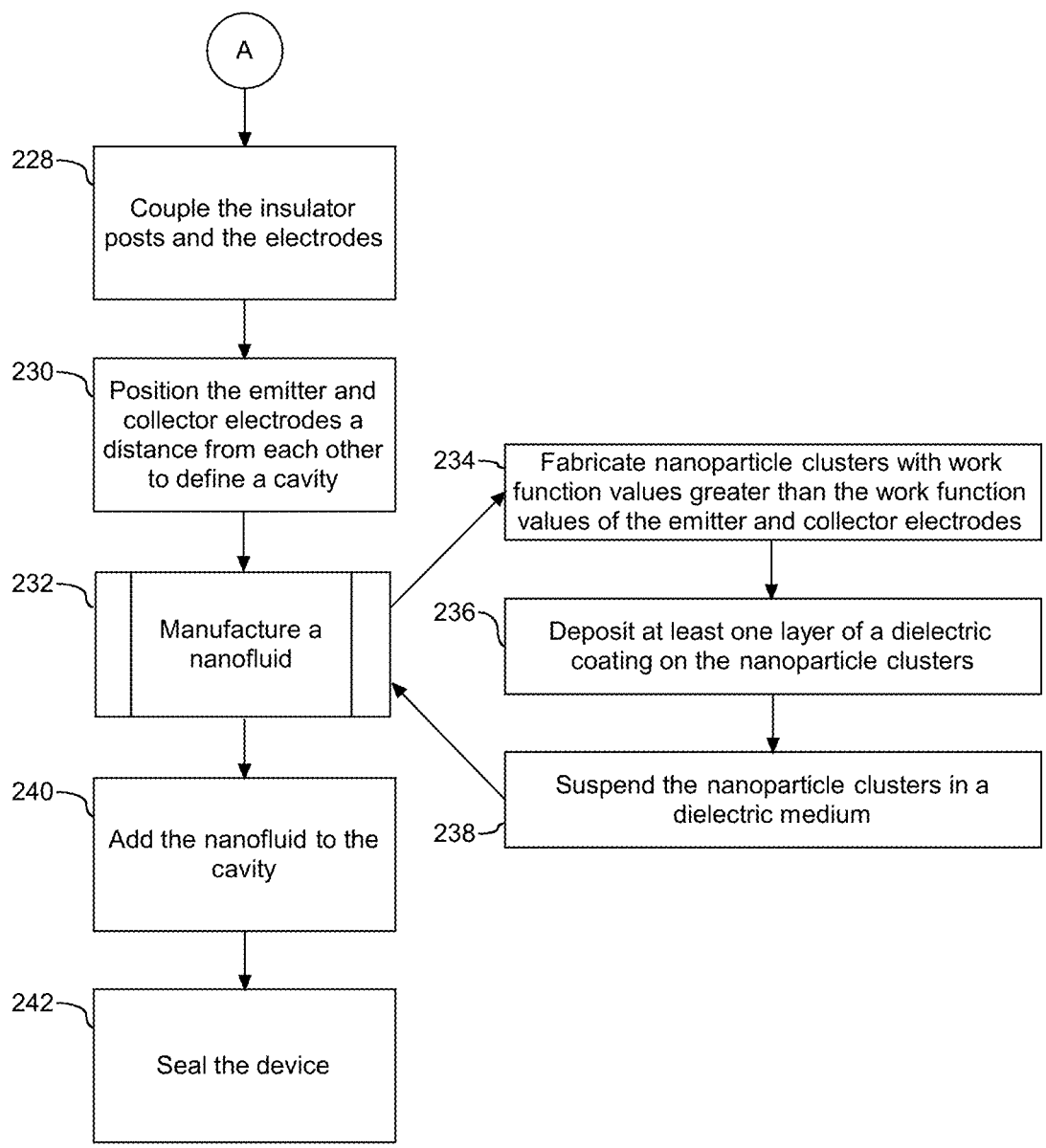
Figure 3:
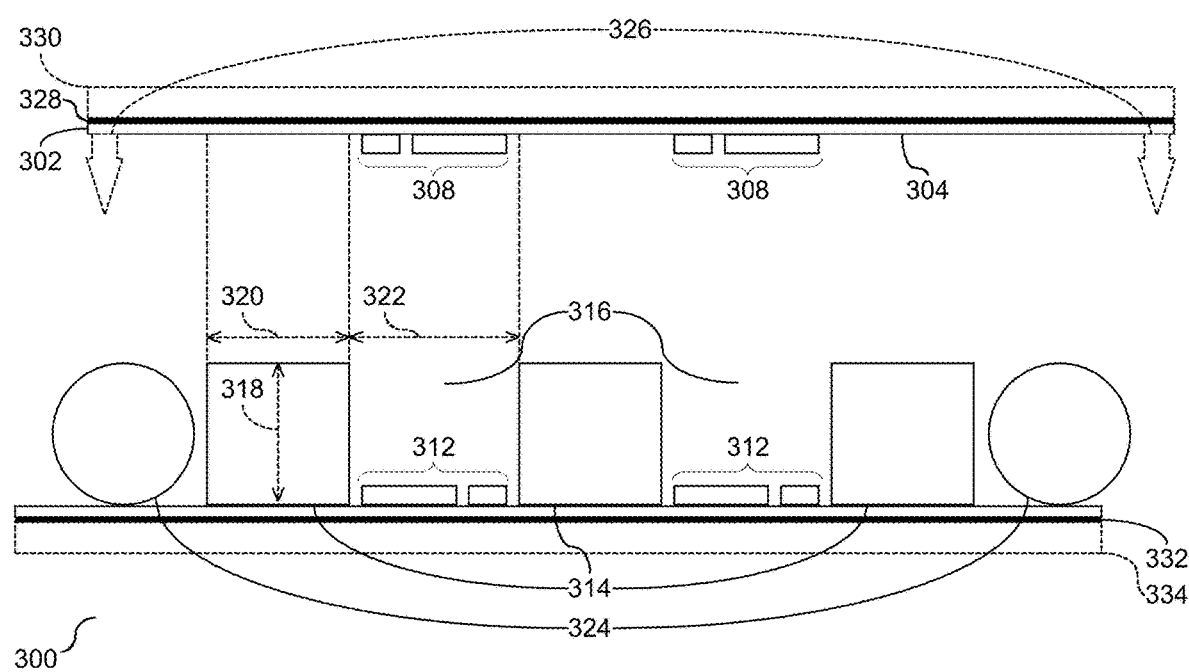
FIG. 3 depicts a cutaway view of one embodiment of a partially constructed nano-scale energy conversion device.

Referring to FIGS. 2A and 2B, a flow chart (200) is provided illustrating a process for manufacturing a nano-scale energy conversion device. Referring to FIG. 3, a diagram (300) is provided illustrating a cutaway view of one embodiment of a partially constructed nano-scale energy conversion device (300) (not shown to scale).

Fabrication of the Emitter Electrode (Cathode)

As shown and described in FIGS. 2A, 2B, and 3, an emitter electrode (302) is fabricated (202) by positioning (204) a graphene film (328) on one side of a polymer base (330) (shown in phantom). The polymer base (330) is approximately 2 nm thick (where this value should be considered non-limiting) and the graphene film (328) is approximately 3.7 angstroms thick. The polymer base (330) is used as a sacrificial assembly component. The graphene film (328) is positioned proximate to an electrospray nozzle of an electrospray device (see FIG. 5, electrospray nozzle (512)). Emitter electrode nanoparticles (not shown) are selected (206) for deposition (208) on the graphene film (328). One principle requirement for selection (206) of the nanoparticle material(s) for the emitter electrode (302) is that the combination of the nanoparticle material and the deposited thermionic emissive material have a combined work function value greater than the work function value of the collector electrode (306) (fabricated as described further elsewhere herein). A second principle requirement is that the difference of the work function values of the two electrodes (302) and (306) (as measured in eV) be above a predetermined value to maximize electron transfer between the two electrodes (302) and (306). A partial list of the appropriate nanoparticle materials for the emitter electrode (302) is provided elsewhere herein. In the exemplary embodiment, at least one layer of W nanoparticles (not shown) is deposited (208) through electrospray onto the graphene film (328) to form a nanoparticle surface (304) on the graphene film (328). In at least one embodiment, the thickness of the layer of nanoparticles to form nanoparticle surface (304) is approximately 2 nm (i.e., the approximate thickness of a nanoparticle), where the 2 nm value should be considered non-limiting. Accordingly, one or more metal materials in the form of nanoparticles are selected as the nanoparticle surface (304) for the emitter electrodes (302) at least partially as a function of decreasing the work function value of the electrodes (302) and (306) and maintaining a work function value differential between the electrodes (302) and (306) above a predetermined value.

Once the W nanoparticle surface (304) is formed (208), the polymer base (330) is removed (210) through an acetone solution, thereby rendering the polymer base (330) as a sacrificial material. Accordingly, the W nanoparticle surface (304) on the graphene film (328) is ready to receive a thermionic emissive material thereon.

At least one layer of a thermionic electron emissive material (308) is deposited (212) on at least a portion of the W nanoparticle surface (304). In one embodiment, a monolayer of the thermionic electron emissive material (308) is deposited (212) on over about at least 50% to about 70% of the surface of the W nanoparticle surface (304). In another embodiment, about 60% of the surface of the W nanoparticle surface (304) receives a monolayer of the material (308). In yet another embodiment, a plurality of layers of the thermionic electron emissive material (308) is deposited on about 60% of the W nanoparticle surface (304). The deposited thermionic electron emissive material (308) is selected to decrease the work function value of the emitter electrode (302) to a value below that of the work function value of the material selected for the W nanoparticle surface (304).

Referring to FIG. 4, a table (400) is provided illustrating elemental work function values of bulk materials. For example, the work function value of W is 4.55 eV. As described further herein, the deposition of $Cs_2O$ (308) on the W nanoparticle surface (304) decreases the work function value of emitter electrode (302) to about 0.88 eV. Accordingly, the combination of materials is positioned to create the desired work function values, and modifying the combination of materials can change the work function value of the combination.

The selection of the thermionic electron emissive material (308) to deposit on the nanoparticle surface (304) is partially based on the desired work function value of the electrode (302) (and electrode (306)) and chemical compatibility between the nanoparticle surface (304) and the deposited material (308). Deposition materials include, but are not limited to, thorium, aluminum, cerium, and scandium, as well as oxides of alkali or alkaline earth metals, such as cesium, barium, calcium, and strontium.

Figure 5:
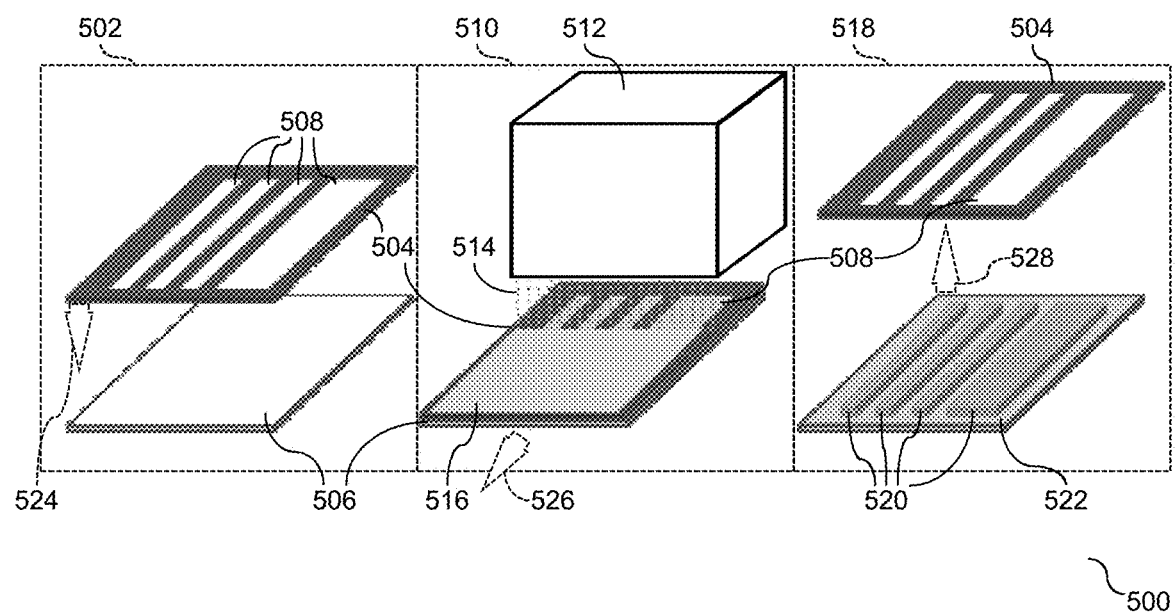
FIG. 5 depicts a perspective view of a process for depositing a thermionic electron emissive material on an electrode substrate.

Referring to FIG. 5, a diagram is provided illustrating a perspective view of a process (500) for depositing a thermionic electron emissive material on an electrode substrate, i.e., a nanoparticle surface such as W nanoparticle surface (136/304) and Au nanoparticle surface (140/310). In a first step (502), a template (504) is positioned proximate to a substrate (506). The template (504) includes a pattern (508) of openings corresponding to a desired deposition pattern on the substrate (506). The template (504) is positioned over one side of the substrate (506) as shown by the arrow (524). The substrate (506) is grounded to facilitate direct deposition of droplets on the substrate (506) to form a pattern of the deposited deposition material(s).

In a second step (510), the substrate (506) with the overlaid template (504) is positioned proximate to an electrospray nozzle (512) of an electrospray device (not shown). An emission of the thermionic electron emissive material issues from the electrospray nozzle (512) as monodispersed droplets (514) is characterized by nanoparticles of uniform size in a dispersed phase. An electrospray of the droplets (514), hereinafter referred to as electrospray, produces monodisperse particles to support deposition of the thermionic electron emissive material in the nanometric scale range. In one embodiment, the electrospray (514) includes a solution of 0.1 molar (M) $Cs_2O$ nanoparticles in ethanol, where the droplet diameter is 10 microns. Also, in one embodiment, the pattern (508) includes a range of 30-50 micron diameter holes with a center-to-center distance ranging from about 60-200 microns, staggered at about 30-60 degree angles, and preferably 45 degree angles. The electrospray (514) with $Cs_2O$ nanoparticles is directed toward the template (504) to form a monolayer (516) as the template (504) and substrate (506) traverse the electrospray (514) as shown by the arrow (526). In one embodiment, $10^{14}$ $Cs_2O$ atoms per square centimeter ($cm^2$) is the target concentration for the substrate (506).

In a third step (518), the template (504) is separated from the substrate (506) as shown by the arrow (528) to leave a patterned thermionic electron emissive material (520) on electrode substrate (506) to form an emitter electrode (522). As shown, four distinct lines of deposited material, collectively referred to as deposited material (520), are overlaid on the W substrate (506). This pattern is merely an example pattern and should not be considered limiting. In one embodiment, the pattern of thermionic electrons may vary as long as the pattern enables operation of the electrode (522). Accordingly, a monolayer of patterned thermionic electron emissive material (520), i.e., $Cs_2O$, is formed on a W substrate (506) to achieve coverage of the substrate (506) in excess of at least 50% to about 70%, with 60% being an optimal coverage. In at least one embodiment, the thickness of the layer of patterned thermionic electron emissive material (520) is approximately 2 nm, where the 2 nm value should be considered non-limiting.

Figure 6:
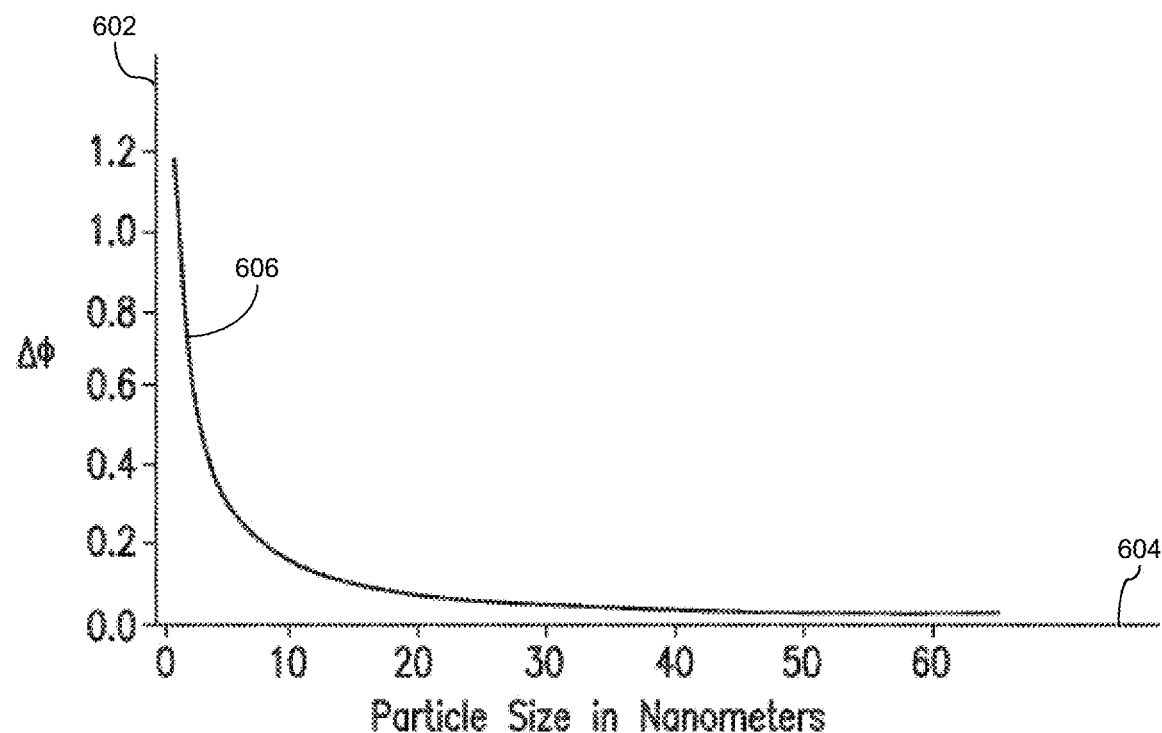
FIG. 6 depicts a graphical representation of work function values as a function of particle size.

Referring to FIG. 6, a diagram is provided illustrating a graphical representation (600) of work function values as a function of particle size. The graph (600) includes a first axis (602), represented herein as a vertical axis (602) that indicates a change in work function value ($\Delta\phi$), where the vertical axis has a range from 0 to 1.2 in increments of 0.2 and in units of eV. The graph (600) also includes a second axis (604), represented herein as a horizontal axis that indicates particle size, where the second axis (604) extends from 0 to 60 in increments of 10 and in units of nanometers (nm). The graph (600) also includes a curve (606) representing the relationship between the particle size and the change in work function value associated with the size. As indicated in the graph (600), the selection of nanoparticle size impacts its work function value. For example, the work function value changes more than 1 eV as the nanoparticle cluster approaches that of a single atom. Conversely, as the nanoparticle size enlarges, the work function value approaches measurements associated with bulk materials. This property of a work function value of a material increasing with decreasing particle size enables the tailoring of each individual application of the nano-scale energy conversion device (100). Accordingly, selecting the particular nanoparticle sizes for the spray depositions (520) on the emitter and collector electrodes (102)/(302) and (104)/(306), respectively, is performed to increase the work function difference between the electrodes to increase the number of electrons transferred during operation of the nano-scale energy conversion device (100).

Figure 7:
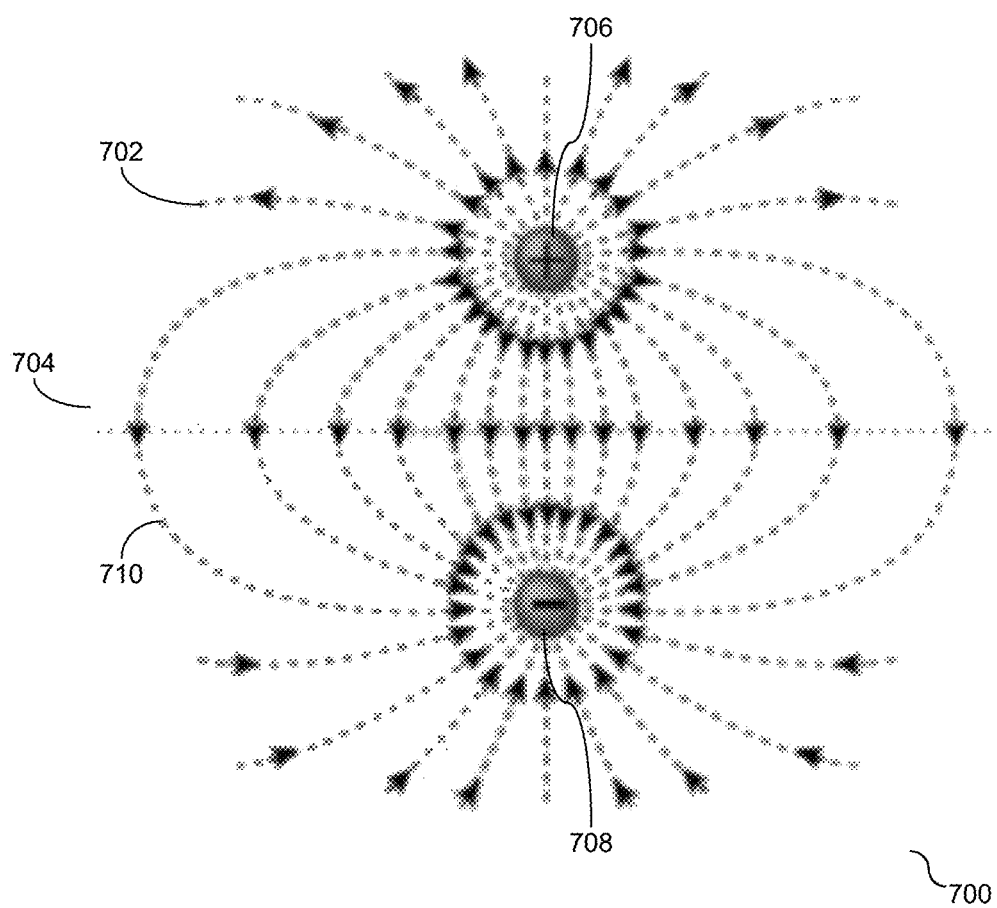
FIG. 7 depicts an overhead view of a covalently-bonded dipole deposited on the surface of an electrode through an electrospray deposition of a thermionic electron emissive material on the electrode substrate.

Referring to FIG. 7, a diagram is provided illustrating an overhead view (700) of a covalently-bonded dipole (702) deposited on the nanoparticle surface (136/304/506/704) of an electrode (302/306) through an electrospray (514) deposition of the thermionic electron emissive material on the electrode nanoparticle surface/substrate (136/304)/(506/704). The nanoparticles in the $Cs_2O$ deposited on the electrode nanoparticle surface (704) form covalent bonds that in turn form the surface dipoles (702) (only one shown in FIG. 7). Within the dipoles (702), a positive charge (706) and an opposing negative charge (708) are formed by charged nano-droplets in the electrospray (514) as they collide with the surface (704). The charges (706) and (708) induce an electric field (710) between the charges (706) and (708) such that the dipole (702) acts as a nano-antenna that modifies the proximate dipole moment in the vicinity of the dipole (702) through inducement of electromagnetic waves proximate thereto as a function of the induced electric field (710). Accordingly, covalently-bonded dipoles (702) deposited on an electrode nanoparticle surface (704) creates a low work function electrode when the coverage area is optimized.

In at least one embodiment, the W emitter electrode (302) and the Au collector electrode (306) have dimensions of 20-50 millimeters (mm) long by 20-50 mm wide and 4-100 nm thick. The 100 nm thickness is based on charge penetration from the emitter electrode (102/302) into the nanofluid (112) and from the collector electrode (104/306) into the second electrical conductor (132). In general, to maximize the charge penetration through the associated electrodes (102/302 and 104/306), a smaller value of the associated thickness is preferred. Therefore, in at least one embodiment, electrodes (102/302 and 104/306) are approximately 4 nm thick.

Fabrication of the Collector Electrode (Cathode)

Referring again to FIGS. 2A, 2B, and 3, the collector electrode (306) is fabricated (214) in a manner substantially similar to that for the emitter electrode (302). A graphene film (332) is positioned (216) on one side of a polymer base (334) (shown in phantom). The polymer base (334) is approximately 2 nm thick (where this value should be considered non-limiting) and the graphene film (332) is approximately 3.7 angstroms thick. The graphene film (332) is positioned proximate to an electrospray nozzle of an electrospray device (see FIG. 5, electrospray nozzle (512)). Collector electrode nanoparticles (not shown) are selected (218) for deposition (220) on the graphene film (332). One principle requirement for selection (218) of the nanoparticle material(s) for the collector electrode (306) is that the combination of the nanoparticle material and the deposited thermionic emissive material have a combined work function value less than the work function value of the emitter electrode (302) (fabricated as described elsewhere herein). A second principle requirement is that the difference of the work function values of the two electrodes (302) and (306) (as measured in eV) be above a predetermined value to maximize electron transfer between the two electrodes (302) and (306). A partial list of the appropriate nanoparticle materials for the collector electrode (306) is provided elsewhere herein. In the exemplary embodiment, at least one layer of Au nanoparticles (not shown) is deposited (220) through electrospray onto the graphene film (332) to form a nanoparticle surface (310) on the graphene film (332). In at least one embodiment, the thickness of the layer of nanoparticles to form nanoparticle surface (332) is approximately 2 nm (i.e., the approximate thickness of a nanoparticle), where the 2 nm value should be considered non-limiting.

Once the Au nanoparticle surface (310) is formed (220), the polymer base (334) is removed (222) through an acetone solution, thereby rendering the polymer base (334) as a sacrificial material. Accordingly, the Au nanoparticle surface (310) on the graphene film (332) is ready to receive a thermionic emissive material thereon.

At least one layer of a thermionic electron emissive material (312) is deposited (224) on at least a portion of the Au nanoparticle surface (310). In one embodiment, a monolayer of the thermionic electron emissive material (312) is deposited on over about at least 50% to about 70% of the surface of the Au nanoparticle surface (310). In another embodiment, about 60% of the surface of the Au nanoparticle surface (310) receives a monolayer of the material (312). In yet another embodiment, a plurality of layers of the thermionic electron emissive material (312) is deposited on about 60% of the Au nanoparticle surface (310). The deposited thermionic electron emissive material (312) is selected to decrease the work function value of the collector electrode (306) to a value below that of the work function value of the material selected for the Au nanoparticle surface (310). Referring to FIG. 4, the table (400) indicates that the work function value of Au is 5.1 eV. Deposition of $Cs_2O$ (312) on the Au nanoparticle surface (310) decreases the work function value of the collector emitter electrode (306) to 0.65 eV. Accordingly, similar to the emitter electrode (302), one or more metal materials in the form of nanoparticles are selected as the nanoparticle surface (310) for the collector electrodes (306) at least partially as a function of decreasing the work function value of the electrodes (302) and (306) and maintaining a work function value differential between the electrodes (302) and (306) above a predetermined value.

Fabrication of the Insulator Posts

Once the electrodes (302) and (306) are fabricated, assembly (200) of the nano-scale energy conversion device (100)/(300) continues. Specifically, one of the collector electrode (306) (as shown in FIG. 3) and the emitter electrode (302) is positioned on a surface (not shown) for support. A template (not shown in FIG. 2) is employed to fabricate (226) a plurality of insulator posts (or columns, standoffs, or micro-pillars) (314) through electrospray deposition to maintain separation between the electrodes (302) and (306) such that the electrodes (302) and (306) and the insulator posts (314) define a cavity (316). In at least one embodiment, the template is a graphite template. In one embodiment, the insulator posts (314) are fabricated with a dielectric material, such as, and without limitation, alkanethiol, sol-gel with aerogel-like properties, corona dope, super corona dope, silicon, silicon-oxide, polymer, or any dielectric material. The templates are constructed to allow for electro-spraying of the alkanethiol such that overspray onto the thermionic electron emissive materials (308) and (312) is minimized. In one embodiment, rather than insulator posts (314), one or more insulator walls are formed that divide the cavity (316) into multiple cavities (316).

The height (318) of the insulator posts (314) ranges from 1 nanometer (nm) to less than 10 nm. Therefore, the cavity (316) extends between the electrodes (302) and (306) for a distance in the range from 1 nanometer (nm) to less than 10 nm. The width (320) of the insulator posts (314) ranges from 1 nanometer (nm) to 10 nm. The width (322) of the cavity (322) ranges from 1 nanometer (nm) to 10 nm. The insulator posts (314) are shown as cubical or cubical like structures and substantially similar in shape and size to that of the cavity (322), although this configuration is not limiting. The distance between insulator posts (314) is within a range defined by about 5-6 nm to about 1 cm. The dimensions and configurations of the insulator posts (314) and cavities (316) are determined based on the planned employment of the nano-scale energy conversion devices (100)/(300). Accordingly, insulator posts (314) (or walls) are fabricated on one of the two electrodes (302) and (306) at a predetermined height to maintain a predetermined distance between the two electrodes (302) and (306) within the nano-scale energy conversion device (100)/(300).

Coupling the Electrodes and Insulator Posts Together

The electrodes (302) and (306) and the insulator posts (314) are coupled (228) together. As described above, and shown in FIG. 3, the insulator posts (314) are deposited on the collector electrode (306). The electrode on which the insulator posts (314) were not formed, as shown in FIG. 3, the emitter electrode (302), is lowered to rest on top of the insulator posts (314) as shown by the arrows (326). An adhesive material (324) is spot-deposited at the outside ends of the nano-scale energy conversion device (100)/(300) to adhere the electrodes (302) and (306) and insulator posts (314) as a unit. In one embodiment, this aspect of the assembly is completed when the device (100)/(300) is sealed or encased with one of silicon or silicon dioxide casing segments, a sealant such as a hot melt adhesive, or by electro-spraying an alkanethiol film gasket around the edge of the device on all sides, with the exception of one side remaining unsealed to facilitate addition of a nanofluid (as discussed further elsewhere herein). The positioning of the electrodes (302) and (306) and the insulator posts (314) define (230) a cavity therebetween (316).

Manufacturing the Nanofluid and Adding the Nanofluid to the Cavities

Figure 8:
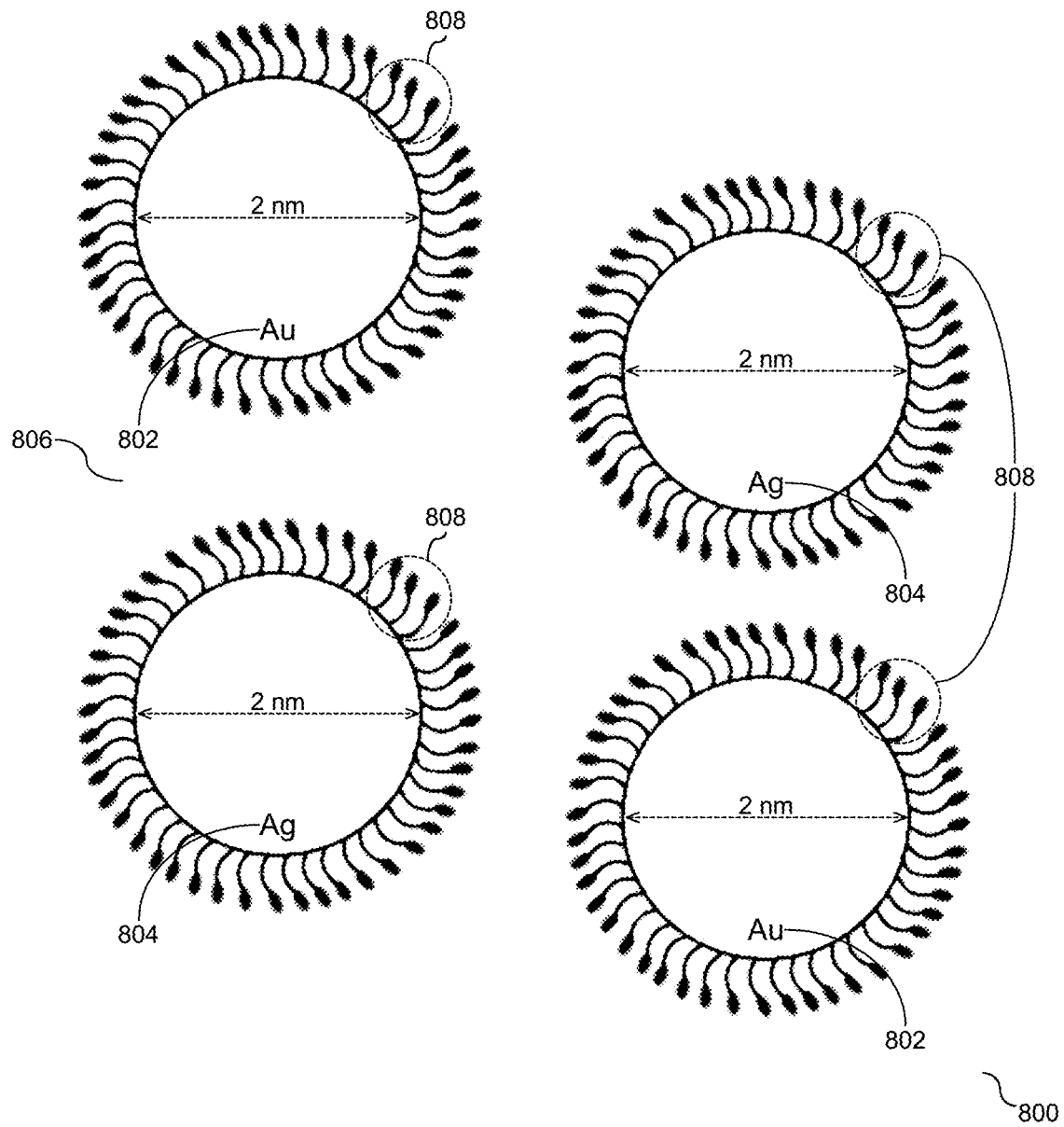
FIG. 8 depicts a cutaway view of one embodiment of a nanofluid including a plurality of nanoparticle clusters suspended in a dielectric medium.

Referring to FIGS. 2A and 2B, the nanofluid (112) is manufactured (232). Referring to FIG. 8, a diagram is provided illustrating a cutaway view of one embodiment of a nanofluid (800) including a plurality of Au and Ag nanoparticle clusters (802) and (804), respectively, suspended in a dielectric medium (806). In some embodiments, and without limitation, the dielectric medium (806) is one of water, silicone oil, and alcohol. Also, in at least one embodiment, the dielectric medium (806) is a sol-gel with aerogel-like properties and low thermal conductivity values that reduce heat transfer therethrough, e.g., thermal conductivity values as low as 0.013 watts per meter-degrees Kelvin (W/m–° K) as compared to the thermal conductivity of water at 20 degrees Celsius (° C.) of 0.6 W/m–° K. Appropriate materials are selected prior to fabricating the nanoparticle clusters (802) and (804). The principle requirement for material selection of the nanoparticle clusters (802) and (804) is that the materials must have work function values that are greater than the work function values for the electrodes (234). Specifically, the work function values of the Au nanoparticle clusters (802) and the Ag nanoparticle clusters (804) are 4.1 eV and 3.8 eV, respectively.

At least one layer of a dielectric coating, such as a monolayer of alkanethiol material (808), is deposited, e.g. electrosprayed, on the nanoparticles (236) to form a dielectric barrier thereon. The alkanethiol material at step (236) includes, but is not limited to dodecanethiol and decanethiol. The deposit of the dielectric coating, such as alkanethiol, reduces coalescence of the nanoparticle clusters (802) and (804). In at least one embodiment, the nanoparticle clusters (802) and (804) have a diameter in the range of 1 nm to 3 nm. In one embodiment, the nanoparticle clusters (802) and (804) have a diameter of 2 nm. The nanoparticle clusters of Au (802) and Ag (804) are tailored to be electrically conductive with charge storage features (i.e., capacitive features), minimize heat transfer through the cavities (110) and (316) with low thermal conductivity values, minimize ohmic heating, eliminate space charges in the cavities (110) and (316), and prevent arcing. The plurality of Au and Ag nanoparticle clusters (802) and (804), respectively, are suspended (238) in the dielectric medium (806). Accordingly, the nanofluid (800), including the suspended nanoparticle clusters (802) and (804), provides a conductive pathway for electrons to travel across the cavities (110) and (316) from the emitter electrode (102) and (302) to the collector electrode (104) and (306) through charge transfer.

The Au nanoparticle clusters (802) are dodecanethiol functionalized gold nanoparticles, with a particle size of 1-3 nm, at about 2% (weight/volume percent) and suspended in toluene. The Ag nanoparticle clusters (804) are dodecanethiol functionalized silver nanoparticles, with a particle size of 1-3 nm, at about 0.25% (weight/volume percent) and suspended in hexane. In one embodiment, the particle size of both the Au and Ag nanoparticle clusters (802) and (804) is at or about 2 nm. The Au and Ag cores of the nanoparticle clusters (802) and (804) are selected for their abilities to store and transfer electrons. In one embodiment, a 50%-50% mixture of Au and Ag nanoparticle clusters (802) and (804) are used. However, a mixture in the range of 1-99% Au-to-Ag could be used as well. Electron transfers are more likely between nanoparticle clusters (802) and (804) with different work functions. In one embodiment, a mixture of nearly equal numbers of two dissimilar nanoparticle clusters (802) and (804) provides good electron transfer. Accordingly, nanoparticle clusters are selected based on particle size, particle material (with the associated work function values), mixture ratio, and electron affinity.

Conductivity of the nanofluid (800) can be increased by increasing concentration of the nanoparticle clusters (802) and (804). The nanoparticle clusters (802) and (804) may have a concentration within the nanofluid (800) of about 0.1 mole/liter to about 2 moles/liter. In at least one embodiment, the Au and Ag nanoparticle clusters (802) and (804) each have a concentration of at least 1 mole/liter.

The stability and reactivity of colloidal particles, such as Au and Ag nanoparticle clusters (802) and (804), are determined largely by a ligand shell formed by the alkanethiol coating (808) adsorbed or covalently bound to the surface of the nanoparticle clusters (802) and (804). The nanoparticle clusters (802) and (804) tend to aggregate and precipitate, which can be prevented by the presence of a ligand shell of the non-aggregating polymer alkanethiol coating (808) enabling these nanoparticle clusters (802) and (804) to remain suspended. Adsorbed or covalently attached ligands can act as stabilizers against agglomeration and can be used to impart chemical functionality to the nanoparticle clusters (802) and (804). Over time, the surfactant nature of the ligand coatings is overcome and the lower energy state of agglomerated nanoparticle clusters is formed. Therefore, over time, agglomeration may occur due to the lower energy condition of nanoparticle cluster accumulation and occasional addition of a surfactant may be used.

The nanofluid (802) is loaded (240) into the cavities (110) and (316) by capillary and vacuum processes through the remaining unsealed side of nano-scale energy conversion device (100)/(300). Assembly is completed when the remaining unsealed side of the nano-scale energy conversion device (100)/(300) is sealed (242) or encased with one of silicon or silicon dioxide casing segments, a sealant such as a hot melt adhesive, or by electrospraying an alkanethiol film gasket around the remaining unsealed side of the device. Accordingly, in at least one embodiment, a plurality of Au and Ag nanoparticle clusters (802) and (804) are mixed together in a dielectric medium (806) to form a nanofluid (112)/(800), the nanofluid (112)/(800) is inserted into the cavities (110)/(316), and the nano-scale energy conversion device (100)/(300) is fully sealed.

In one embodiment, the dimensions of the nano-scale energy conversion device (100)/(300) is approximately 20-50 mm long by approximately 20-50 mm wide by approximately 9-19 nm thick (about 4 nm for each electrode (102/302 and 104/306) and about 1 nm to less than about 10 nm for the cavity (110/316) therebetween). The thickness of the device (100/300) is determined based on the desired electron flow therein and the other two dimensions are scalable based on the desired overall power output of the device (100/300).

Principles of Operation of the Nano-scale Energy Conversion Device

Figure 9:
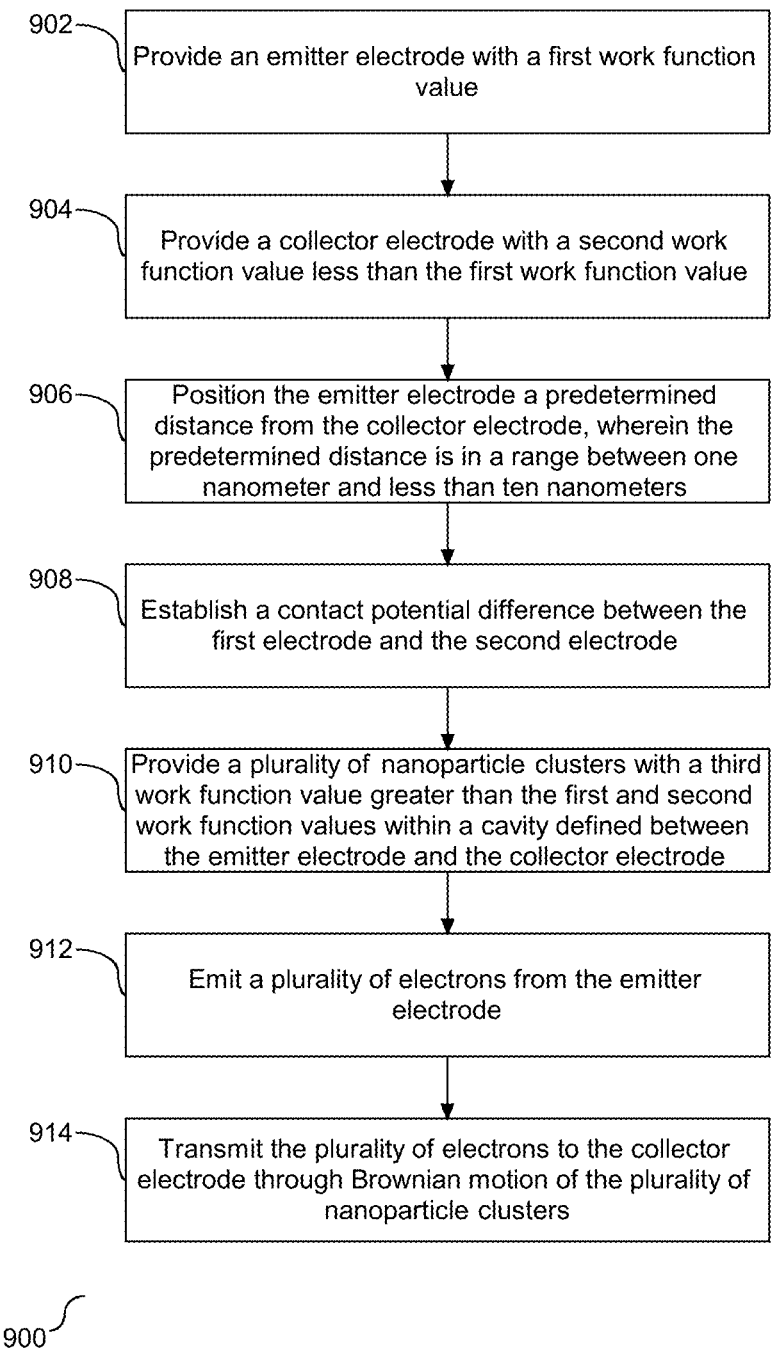
FIG. 9 depicts a flow chart illustrating a process for generating electric power with the nano-scale energy conversion device.

Referring again to FIG. 9, a flow chart is provided illustrating a process (900) for generating electric power with the nano-scale energy conversion device (100). As described herein, an emitter electrode (102) is provided (902) and a collector electrode (104) is provided (904), where the work function value of the collector electrode (104) is less than the work function value of the emitter electrode (102). The emitter electrode (102) and the collector electrode (104) are positioned a predetermined distance from each other, i.e., about 1 nm to less than about 10 nm.

Figure 10:
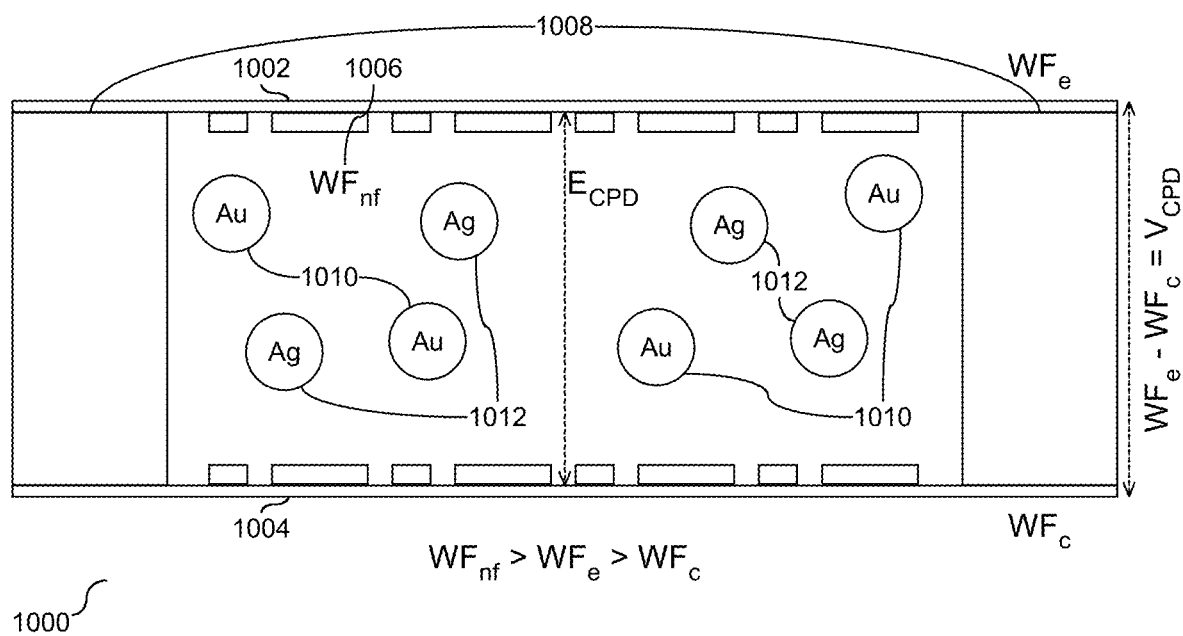
FIG. 10 depicts a cutaway view of an embodiment of the nano-scale energy conversion device showing a relationship between the work functions of the electrodes and nanofluid therein.

Referring to FIG. 10, a diagram is provided illustrating a cutaway view of an embodiment of the nano-scale energy conversion device (1000) showing a relationship between the work functions of an emitter electrode (1002) ($WF_e$), collector electrode (1004) ($WF_c$), and nanofluid (1006) ($WF_{nf}$) therein. FIG. 10 also shows a pair of insulator posts (1008) separating the electrodes (1002) and (1004). The difference between the $WF_e$ and $WF_c$ establishes (908) a contact potential difference (CPD) between the two electrodes (1002) and (1004). Specifically, a voltage differential ($V_{CPD}$) is induced across the nanofluid (1006) due to the dissimilar metals of electrodes (1002) and (1004), e.g., W and Au, respectively, both including at least a monolayer of $Cs_2O$ over about 60% of the opposing surfaces thereof. In this embodiment, the value for $WF_e$ is 0.88 eV and the value for $WF_c$ is 0.65 eV, to induce a $V_{CPD}$ of 0.23 eV. The $V_{CPD}$ induces an electric field ($E_{CPD}$) that has to be overcome to transmit electrons through the nanofluid (1006) from the emitter electrode (1002) to the collector electrode (1004). Accordingly, as described further herein, this induced CPD enables thermionic emission of electrons from the emitter electrode (1002) toward the collector electrode (1004).

The nanofluid (1006) including a plurality of Au nanoparticle clusters (1010) and Ag nanoparticle clusters (1012) is provided (910). In this embodiment, the work functions of the Au nanoparticle clusters (1010) and Ag nanoparticle clusters (1012) are 4.1 eV and 3.8 eV, respectively. Therefore, a collective work function $WF_{nf}$ is greater than $WF_e$ which is greater than $WF_c$. This relationship of the work function values of the Au and Ag nanoparticle clusters (1010) and (1012) optimizes the transfer of electrons to the nanoparticle clusters (1010) and (1012) through Brownian motion and electron hopping (discussed further herein). Accordingly, the selection of materials within the nano-scale energy conversion device (1000) optimizes electric current generation and transfer therein through enhancing the release of electrons from the emitter electrode (1002) and the conduction of the released electrons across the nanofluid (1006) to the collector electrode (1004).

Figure 11:
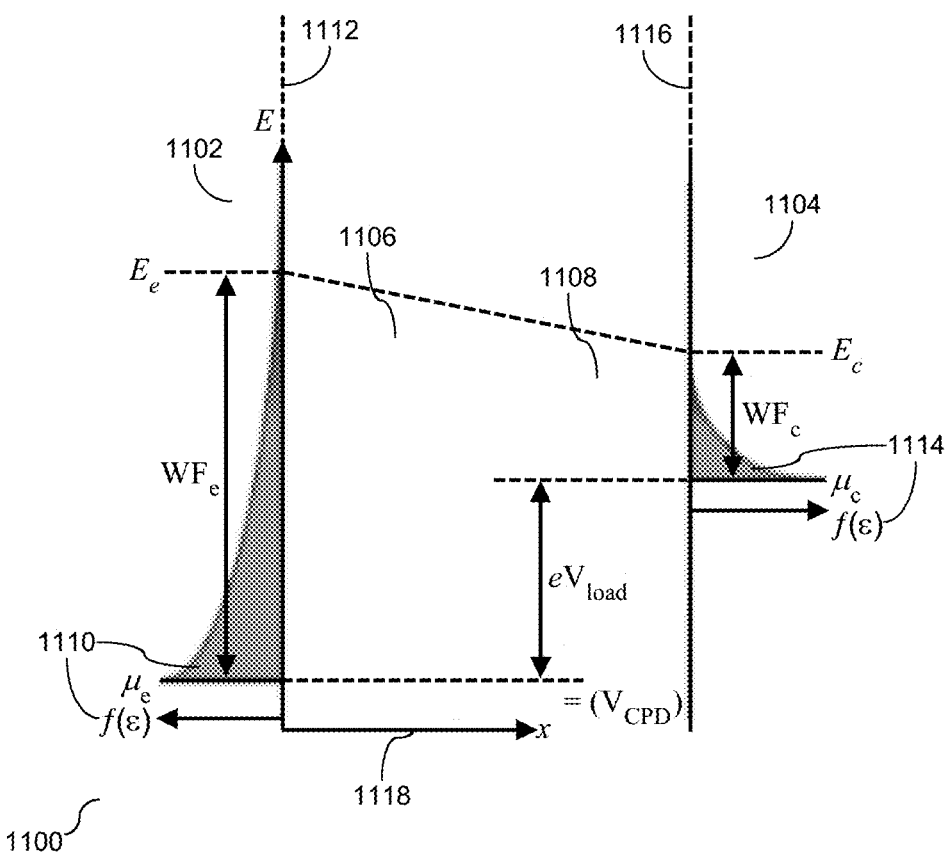
FIG. 11 depicts a graphical representation of the effect of the emitter work function value being larger than the collector work function value.

Referring to FIG. 11, a diagram is provided illustrating a graphical representation (1100) of the effect of the emitter work function value being larger than the collector work function value. The emitter electrode (1102) and the collector electrode (1104) are separated by the cavity (1106) that is filled with nanofluid (1108). A thermal distribution function (1110) of the electrons in the emitter electrode (1102) above the electrochemical potential (the Fermi level ($\mu_e$)) as a function of the distance from the surface (1112) of the electrode (1102) is shown. The work function ($WF_e$) of the emitter electrode (1102) extends from the Fermi level ($\mu_e$) of the emitter electrode (1102) to an electrical potential of the emitter electrode ($E_e$). Similarly, a thermal distribution function (1114) of the electrons in the collector electrode (1104) above the electrochemical potential (the Fermi level ($\mu_c$)) as a function of the distance from the surface (1116) of the electrode (1104) is shown. The work function ($WF_c$) of the collector electrode (1104) extends from the Fermi level ($\mu_c$) of the collector electrode (1104) to the electrical potential of the collector electrode ($E_c$). The Fermi level ($\mu_c$) of the collector electrode (1104) is shifted upward due to the electrical potential of a load ($eV_{load}$) connected to the electrodes (1102) and (1104) inducing a contact potential difference voltage ($V_{CPD}$) across the cavity (1108), where $eV_{load}$ and $W_{CPD}$ are equal to each other. An electrical potential function (E) is shown declining from the surface (1112) of the emitter electrode (1102) to the surface (1116) of the collector electrode (1104), i.e., from $E_e$ to $E_c$ linearly as the electrons traverse the nanofluid (1106) and the cavity (1108) as indicated by the arrow (1118). The emitter work function ($WF_e$) must be greater than the collector work function ($WF_c$) so that electrons are accelerated toward the collector electrode (1104) and not accelerated back towards the emitter electrode (1102). Accordingly, the selection of the materials for the emitter electrode (1102) and the collector electrode (1104) with the associated work function and Fermi level values determining operational functionality of the nano-scale energy conversion device (100).

Figure 12:
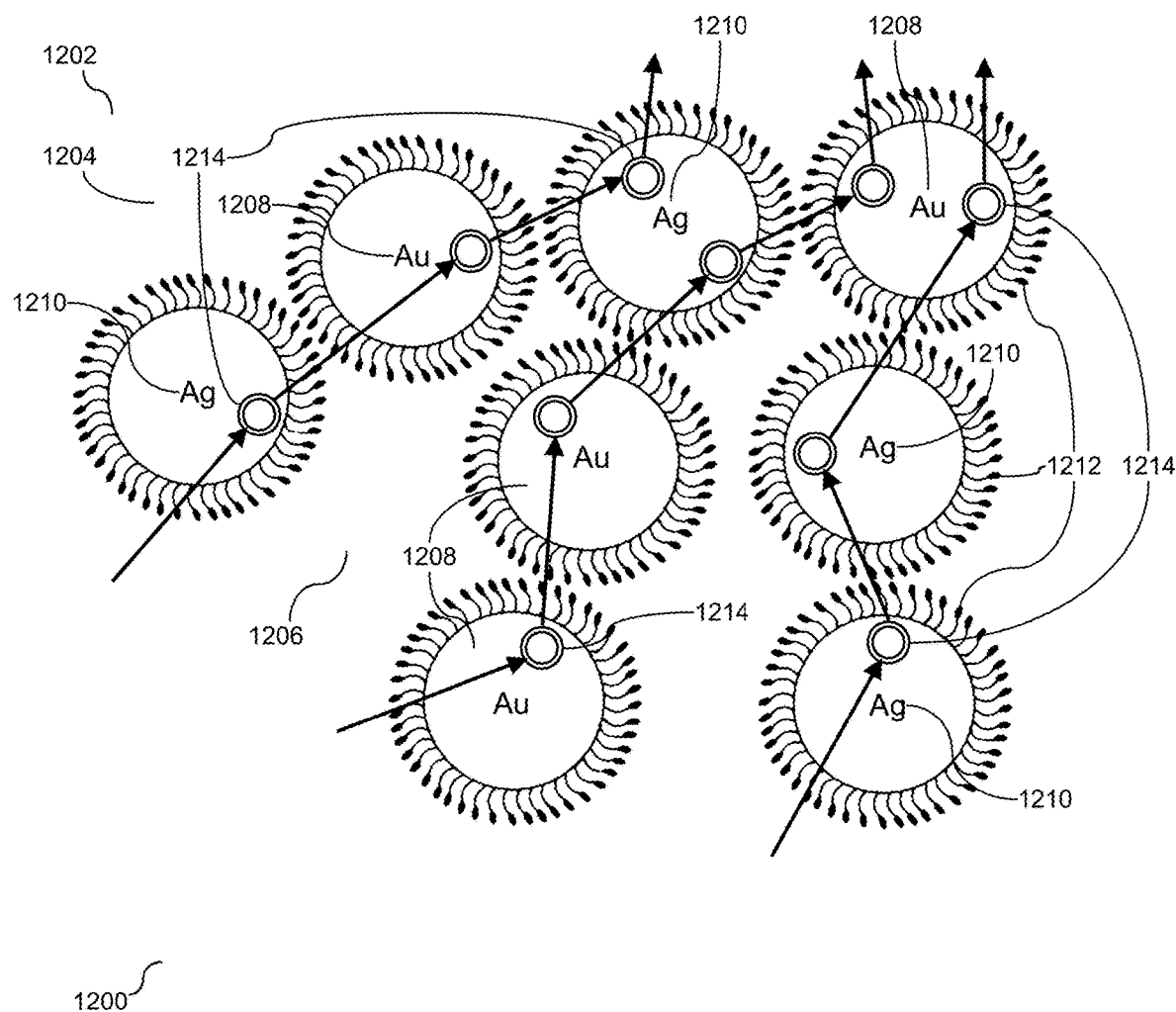
FIG. 12 depicts a schematic view of electron transfer through collisions of the nanoparticle clusters.

Referring to FIG. 12 (and FIGS. 1 and 9), a diagram (1200) is provided illustrating electron transfer through collisions of a plurality of nanoparticle clusters. As shown in FIG. 12, the nanofluid (1202) includes a plurality of nanoparticle clusters (1204) suspended in a dielectric medium (1206). In the embodiment shown, the plurality of nanoparticle clusters (1204) includes Au nanoparticle clusters (1208) and Ag nanoparticle clusters (1210). The Au nanoparticle clusters (1208) have a work function value of about 4.1 eV and the Ag nanoparticle clusters (1210) have a work function value of about 3.8 eV. These work function values of the nanoparticle clusters (1204) are much greater than the work function values of the emitter electrode (102) (0.88 eV) and the collector electrode (104) (0.65 eV). The nanoparticle clusters (1204) are coated with alkanethiol to form a dielectric barrier (1212) thereon to reduce coalescence of the nanoparticle clusters (1204). In one embodiment, the nanoparticle clusters (1204) have a diameter of about 2 nm. The nanoparticle clusters (1204) are tailored to be electrically conductive with capacitive (i.e., charge storage) features while minimizing heat transfer therethrough. Accordingly, suspended nanoparticle clusters (1204) provide a conductive pathway for electrons to travel across the cavity (110) from the emitter electrode (102) to the collector electrode (104) through charge transfer.

Thermally-induced Brownian motion causes the nanoparticle clusters (1204) to move within the dielectric medium (1206), and during this movement they occasionally collide with each other and with the electrodes (102) and (104). As the nanoparticle clusters (1204) move and collide within the dielectric medium (1206), the nanoparticle clusters (1204) chemically and physically transfer charge. The nanoparticle clusters (1204) transfer charge chemically when electrons (1214) hop from the electrodes (102) and (104) to the nanoparticle clusters (1204) and from one nanoparticle cluster (1204) to another nanoparticle. The hops primarily occur during collisions. Due to differences in work function values, electrons (1214) are more likely to move from the emitter electrode (102) to the collector electrode (104) via the nanoparticle clusters (1204) rather than in the reverse direction. Accordingly, a net electron current from the emitter electrode (102) to the collector electrode (104) via the nanoparticle clusters (1204) is the primary and dominant current of the nano-scale energy conversion device (100).

The nanoparticle clusters (1204) transfer charge physically (i.e., undergo transient charging) due to the ionization of the nanoparticle clusters (1204) upon receipt of an electron and the electric field generated by the differently charged electrodes (102) and (104). The nanoparticle clusters (1204) become ionized in collisions when they gain or lose an electron (1214). Positive and negative charged nanoparticle clusters (1204) in the nanofluid (1202) migrate to the negatively charged collector electrode (104) and the positively charged emitter electrode (102), respectively, providing a current flow. This ion current flow is in the opposite direction from the electron current flow, but much less in magnitude than the electron flow.

Some ion recombination in the nanofluid (1202) does occur, which diminishes both the electron and ion current flow. Electrode separation may be selected at an optimum width to maximize ion formation and minimize ion recombination. In the exemplary embodiment, the electrode separation is slightly less than 10 nm. The nanoparticle clusters (1204) have a maximum dimension of about 2 nm, so the electrode separation is about 3 to 5 nanoparticle clusters (1204). This separation distance provides sufficient space within the cavity for nanoparticle clusters (1204) to move around and collide, while minimizing ion recombination. For example, in one embodiment, an electron can hop from the emitter electrode (102) to a first nanoparticle cluster (1204) and then to a second, third, fourth, or fifth nanoparticle cluster (1204) before hopping to the collector electrode (104). A reduced quantity of hops mitigates ion recombination opportunities. Accordingly, ion recombination in the nanofluid (1202) in minimized through an electrode separation distance selected at an optimum width to maximize ion formation and minimize ion recombination.

When the emitter electrode (102) and the collector electrode (104) are initially brought into close proximity, the electrons of the collector electrode (104) have a higher Fermi level than the electrons of the emitter electrode (102) due to the lower work function of the collector electrode (104). The difference in Fermi levels drives a net electron current that transfers electrons from the collector electrode (104) to the emitter electrode (102) until the Fermi levels are equal, i.e., the electrochemical potentials are balanced and thermodynamic equilibrium is achieved. The transfer of electrons between the emitter electrode (102) and the collector electrode (104) results in a difference in charge between the emitter electrode (102) and the collector electrode (104). This charge difference sets up the voltage of the contact potential difference ($V_{CPD}$) and an electric field between the emitter electrode (102) and the collector electrode (104), where the polarity of the $V_{CPD}$ is determined by the material having the greatest work function With the Fermi levels equalized, no net current will flow between the emitter electrode (102) and the collector electrode (104). Accordingly, electrically coupling the emitter electrode (102) and the collector electrode (104) with no external load results in attaining the contact potential difference between the electrodes (102 and 104) and no net current flow between the electrodes (102) and (104) due to attainment of thermodynamic equilibrium between the two electrodes (102) and (104).

The nano-scale energy conversion device (100) can generate electric power (e.g., at room temperature) with or without additional heat input. Heat added to the emitter electrode (102) will raise its temperature and the Fermi level of its electrons. With the Fermi level of the emitter electrode (102) higher than the Fermi level of the collector electrode (104), a net electron current will flow from the emitter electrode (102) to the collector electrode (104) through the nanofluid (1202). If the external circuit (128) is connected, the same amount of electron current will flow through the external circuit current (134) from the collector electrode (104) to the emitter electrode (102). The heat energy added to the emitter electrode (102) is carried by the electrons (1214) to the collector electrode (102). The bulk of the added energy is transferred to the external circuit (128) for conversion to useful work and some of the added energy is transferred in collisions to the collector electrode (104) and eventually lost to ambient as waste energy. As the energy input to the emitter electrode (102) increases, the temperature of the electrode (102) increases, and the electron transmission from the emitter electrode (102) increases, thereby generating more current. As the emitter electrode (102) releases (912) electrons onto the nanoparticle clusters (1204), energy is stored in the nano-scale energy conversion device (100). Accordingly, the nano-scale energy conversion device (100) generates, stores, and transfers charge and moves heat energy if a temperature difference exists, where added thermal energy causes the production of electrons to increase from the emitter electrode (102) into the nanofluid (1202).

The nanofluid (1202) is used to transfer charges from the emitter electrode (102) to one of the mobile nanoparticle clusters (1204) (via intermediate contact potential differences) from the collisions of the nanoparticle cluster (1204) with the emitter electrode (102) induced by Brownian motion (914) of the nanoparticle cluster (1204). The selection of dissimilar nanoparticle clusters (1204) that include Au nanoparticle clusters (1208) and Ag nanoparticle clusters (1210) that have much greater work functions of about 4.1 eV and about 3.8 eV, respectively, optimizes transfer of electrons to the nanoparticle clusters (1204) from the emitter electrode (102) and to the collector electrode (104).

As the electrons (1214) hop from nanoparticle cluster (1204) to nanoparticle cluster (1204), single electron charging effects that include the additional work required to hop another electron (1214) on to a nanoparticle cluster (1204) if an electron (1214) is already present on the nanoparticle cluster (1204) determine if hopping additional electrons (1214) onto that particular nanoparticle cluster (1204) is possible. Specifically, the nanoparticle clusters (1204) include a voltage feedback mechanism that prevents the hopping of more than a predetermined number of electrons to the nanoparticle cluster (1204). This prevents more than the allowed number of electrons (n) from residing on the nanoparticle cluster simultaneously. In one embodiment, only one electron (1214) is permitted on any nanoparticle cluster (1204) at any one time. Therefore, during conduction of current through the nanofluid (1202), a single electron (1214) hops onto the nanoparticle cluster (1204). The electron (1214) does not remain on the nanoparticle cluster (1204) indefinitely, but hops off to either the next nanoparticle cluster (1204) or the collector electrode (104) through collisions resulting from the Brownian motion of the nanoparticle clusters (1204). However, the electron (1214) does remain on the nanoparticle cluster (1204) long enough to provide the voltage feedback required to prevent additional electrons (1214) from hopping simultaneously onto the nanoparticle cluster (1204). The hopping of electrons (1214) across the nanoparticle clusters (1204) avoids resistive heating associated with current flow in a media. Notably, the nano-scale energy conversion device (100) does not require pre-charging by an external power source in order to introduce electrostatic forces. This is due to the device (100) being self-charged with triboelectric charges generated upon contact between the nanoparticle clusters (1204) due to Brownian motion. Accordingly, the electron hopping across the nanofluid (1202) is limited to one electron (1214) at a time residing on a nanoparticle cluster (1204).

As the electrical current starts to flow through the nanofluid (1202), a substantial energy flux away from the emitter electrode (102) is made possible by the net energy exchange between the emitted (1214) and replacement electrons. The replacement electrons from the second electrical conductor (132) connected to the emitter electrode (102) do not arrive with a value of energy equivalent to an average value of the Fermi energy associated with the material of emitter electrode (102), but with an energy that is lower than the average value of the Fermi energy. Therefore, rather than the replacement energy of the replacement electrons being equal to the chemical potential of the emitter electrode (102), the electron replacement process takes place in the available energy states below the Fermi energy in the emitter electrode (102). The process through which electrons are emitted above the Fermi level and are replaced with electrons below the Fermi energy is sometimes referred to as an inverse Nottingham effect. Accordingly, the low work function value of about 0.88 eV for the emitter electrode (102) allows for the replacement of the emitted electrons with electrons with a lower energy level to induce a cooling effect on the emitter electrode (102).

As described this far, the principle electron transfer mechanism for operation of the nano-scale energy conversion device (100) is thermionic energy conversion or harvesting. In some embodiments, thermoelectric energy conversion is conducted in parallel with the thermionic energy conversion. In at least one of such embodiments, either the emitter electrode (102) or the collector electrode (104), or both, include at least one material selected from the group consisting of lead selenide telluride (PbSeTe) and lead telluride (PbTe). PbSeTe and PbTe are thermoelectric conversion materials that, when introduced into the emitter electrode (102), allows for emission of electrons from the emitter electrode (102) through thermoelectric electron emission. In some embodiments, the PbSeTe or PbTe is also introduced into the collector electrode (104) to multiply the number of electrons being introduced into the external circuit current (134). Similarly, in some embodiments, the PbSeTe or PbTe is introduced at least a portion of the suspended nanoparticle clusters (1204) to multiply the number of electrons being introduced into the external circuit current (134). For example, an electron (1214) colliding with a nanoparticle cluster (1204) with a first energy may induce the emission of two electrons at second and third energy levels, respectively, where the first energy level is greater than the sum of the second and third energy levels. In such circumstances, the energy levels of the emitted electrons are not as important as the number of electrons. Accordingly, the introduction of the PbSeTe or PbTe as described herein increases conversion of thermal energy to electrical energy through further increasing the rate of transfer of electrons through the nano-scale energy conversion device (100).

Furthermore, the PbSeTe or PbTe used as described herein may be an n-type compound doped with a transition metal in the form of bismuth (Bi) or antimony (Sb). The doping of the n-type compound of PbSeTe or PbTe with the transition metal further increases conversion of thermal energy to electrical energy through further increasing the rate of transfer of electrons through the nano-scale energy conversion device (100). Accordingly, introducing PbSeTe or PbTe, doped with, or without the transition metal into the emitter electrode (102), the collector electrode (104), and the nanoparticle clusters (1204), increases conversion of thermal energy to electrical energy through increasing the rate of transfer of electrons through the nano-scale energy conversion device (100).

A plurality of nano-scale energy conversion devices (100) are distinguished by at least one embodiment having the thermoelectric energy conversion features described herein. In general, the nanofluid (1202) is selected for operation of the nano-scale energy conversion devices (100) within more than one temperature range. In one embodiment, the temperature range of the associated nano-scale energy conversion device (100) is controlled to modulate a power output of the device (100). In general, as the temperature of the emitter electrode (102) increases, the rate of thermionic emission therefrom increases. The operational temperature ranges for the nanofluid (1202) are based on the desired output of the nano-scale energy conversion device (100), the temperature ranges that optimize thermionic conversion, the temperature ranges that optimize thermoelectric conversion, and fluid characteristics. Therefore, different embodiments of the nanofluid (1202) are designed for different energy outputs of the device (100). For example, for the nanofluid (1202), when the dielectric medium (1206) is silicone oil, the temperature of the nanofluid (1202) should be maintained at less than 250° C. to avoid deleterious changes in energy conversion due to the viscosity changes of the silicone oil above 250° C. In one embodiment, the temperature range of the nanofluid (1202) for substantially thermionic emission only is approximately room temperature (i.e., about 20° C. to about 25° C.) up to about 70-80° C., and the temperature range of the nanofluid for thermionic and thermo-electric conversion is above 70-80° C., with the principle limitations being the temperature limitations of the materials. The nanofluid (1202) for operation including thermoelectric conversion includes a temperature range that optimizes the thermoelectric conversion through optimizing the power density within the nano-scale energy conversion device (100), thereby optimizing the power output of the device (100). In at least one embodiment, a mechanism for regulating the temperature of the first nanofluid (1202) includes diverting some of the energy output of the device (100) into the nanofluid (1202). Accordingly, the cavities (110) of specific embodiments of the nano-scale energy conversion device (100) may be filled with the nanofluid (1202) to employ thermoelectric energy conversion with thermionic energy conversion above a particular temperature range, or thermionic energy conversion by itself below that temperature range.

As described elsewhere herein, in at least one embodiment, the dielectric medium (1206) has thermal conductivity values less than about 1.0 watts per meter-degrees Kelvin (W/m° K). In at least one embodiment, the thermal conductivity of the dielectric medium (1206) is as low as about 0.013 watts per meter-degrees Kelvin (W/m° K), as compared to the thermal conductivity of water at about 20 degrees Celsius (° C.) of 0.6 W/m° K. Accordingly, the first nanofluid (1202) minimizes heat transfer through the cavity (110) with low thermal conductivity values. Since the heat transport in a low thermal conductivity first nanofluid (1202) can be small, a high temperature difference between the two electrodes (102) and (104) can be maintained during operation. These embodiments are designed for those nano-scale energy conversion devices (100) that employ thermionic emission only, where minimal heat transfer through the first nanofluid (1202) is desired.

In some alternative embodiments of nano-scale energy conversion devices (100), greater heat transfer through the nanofluid (1202) is desired. The nano-scale energy conversion device (100) has a cavity (110) dimension of less than about 10 nm. In this predetermined distance range of about 1 nm to less than about 10 nm, thermal conductivity values and electrical conductivity values of the first nanofluid (1202) are enhanced over thermal and electrical conductivity values of the first nanofluid (1202) when the predetermined distance of the cavity is greater than about 100 nm. This increase of thermal and electrical conductivity values of the nanofluid (1202) is due to a number of factors. The first factor is that of enhanced phonon and electron transfer between the plurality of nanoparticle clusters (1204) within the nanofluid (1202), enhanced phonon and electron transfer between the plurality of nanoparticle clusters (1204) and the first electrode (102), and enhanced phonon and electron transfer between the plurality of nanoparticle clusters (1204) and the second electrode (104). A second factor is the enhanced influence of Brownian motion of the nanoparticle clusters (1204) in the more confining volume seen in the scale of less than about 10 nm. As the distance between electrodes (106) decreases below about 10 nm, the fluid continuum characteristics of the nanofluid (1202) with the suspended nanoparticle clusters (1204) is altered. For example, as the ratio of particle size to volume of the cavity (110) increases, the random and convection like effects of Brownian motion in a dilute solution dominate. Therefore, collisions of the nanoparticle clusters (1204) with the surfaces of other nanoparticle clusters (1204) and the electrodes (102) and (104) increase thermal and electrical conductivity values due to the enhanced phonon and electron transfer. A third factor is the at least partial formation of nanoparticle cluster (1204) matrices within the nanofluid (1202). In one embodiment, the formation of the matrices is based on the factors of time and/or concentration of the nanoparticle clusters (1204) in the nanofluid (1202). Under certain conditions, the nanoparticle clusters (1204) will form matrices within the nanofluid (1202) as a function of close proximity to each other with some of the nanoparticle clusters (1206) remaining independent from the matrices. A fourth factor is the predetermined nanoparticle cluster (1204) density, which in one embodiment is about one mole per liter. Accordingly, the very small dimensions of the cavity (110) of less than about 10 nm causes an increase in the thermal and electrical conductivity values of the nanofluid (1202) therein.

In addition, the nanoparticle clusters (1204) are extremely thin and they are often considered to have only one dimension, i.e., their characteristic length. This extreme thinness restricts electrons and holes in a process called quantum confinement, which increases electrical conductivity. The collision of particles with different quantum confinement facilitates transfer of charge to the electrodes (102) and (104). A nanoparticle cluster's (1204) small size also increases the influence of its surfaces, thereby tending to increase thermal conductivity. The embodiments of nano-scale energy conversion device (100) have an enhanced electrical conductivity value greater than about 1 Siemens per meter (S/m). Also, the embodiments of device (100) with the enhanced thermal conductivity have a thermal conductivity value greater than about 1 W/m–° K.

The thermionic emission of electrons (1214) from the emitter electrode (102) and the transfer of the electrons (1214) across the nanofluid (1202) from nanoparticle cluster (1204) to nanoparticle cluster (1204) through hopping are both quantum mechanical effects.

The release of electrons from the emitter electrode (102) through thermionic emission as described herein is an energy selective mechanism. A Coulombic barrier in the cavity (110) between the emitter electrode (102) and the collector electrode (104) is induced through the interaction of the nanoparticles (1204) with the electrodes (102) and (104) inside the cavity (110). The Coulombic barrier is at least partially induced through the number and material composition of the plurality of nanoparticle clusters (1204). The Coulombic barrier induced through the nanofluid (1202) provides an energy selective barrier on the order of magnitude of about 1 eV. Accordingly, the nanofluid (1202) provides an energy selective barrier to electron emission and transmission.

To overcome the Coulombic barrier and allow electrons (1214) to be emitted from the emitter electrode (102) above the energy level needed to overcome the barrier, selection of the materials for the emitter electrode (102) and the collector electrode (104) are selected for their work function values and Fermi level values. The Fermi levels of the two metal electrodes (102) and (104) and the nanoparticle cluster (1204) will try to align by tunneling electrons (1214) from the electrodes (102) and (104) to the nanoparticle cluster (1204). The difference in potential between the two electrodes (102) and (104) (described elsewhere herein) overcomes the Coulombic barrier and the thermionic emission of electrons (1214) from the emitter electrode (102) occurs with sufficient energy to overcome the Coulombic block. Notably, for cooling purposes, removing higher energy electrons from the emitter electrode (102) causes the emission of electrons (1214) to carry away more heat energy from the emitter electrode (102) than is realized with lower energy electrons. Accordingly, the energy selective barrier is overcome through the thermionic emission of electrons at a higher energy level than would be otherwise occurring without the Coulombic barrier.

Once the electrons (1214) have been emitted from the emitter electrode (102) through thermionic emission, the Coulombic barrier continues to present an obstacle to further transmission of the electrons (1214) through the nanofluid (1202). Smaller gaps on the order of about 1-10 nm facilitates electron hopping, i.e., field emission, of short distances across the cavity (110). The energy requirements for electron hopping are much lower than the energy requirements for thermionic emission, therefore the electron hopping has a significant effect on the energy generation characteristics of the device (100). The design of the nanofluid (1202) enables energy selective tunneling (hopping) that is a result of the special form of the barrier (which has wider gap for low energy electrons) which results in electrons above the Fermi level being the principal hopping component. The direction of the electron hopping is determined through the selection of the different materials for the electrodes (102) and (104) and their associated work function and Fermi level values. The electron hopping across the nanofluid (1202) transfers heat energy with electrons (1214) across the cavity (110) while maintaining a predetermined temperature gradient such that the temperature of the fluid (1214) is relatively unchanged during the electron transfer. Accordingly, the emitted electrons transport heat energy from the emitter electrode (102) across the cavity (110) to the collector electrode (104) without increasing the temperature of the nanofluid (1202).

Sample Applications of the Nano-Scale Energy Conversion Devices

Figure 13:
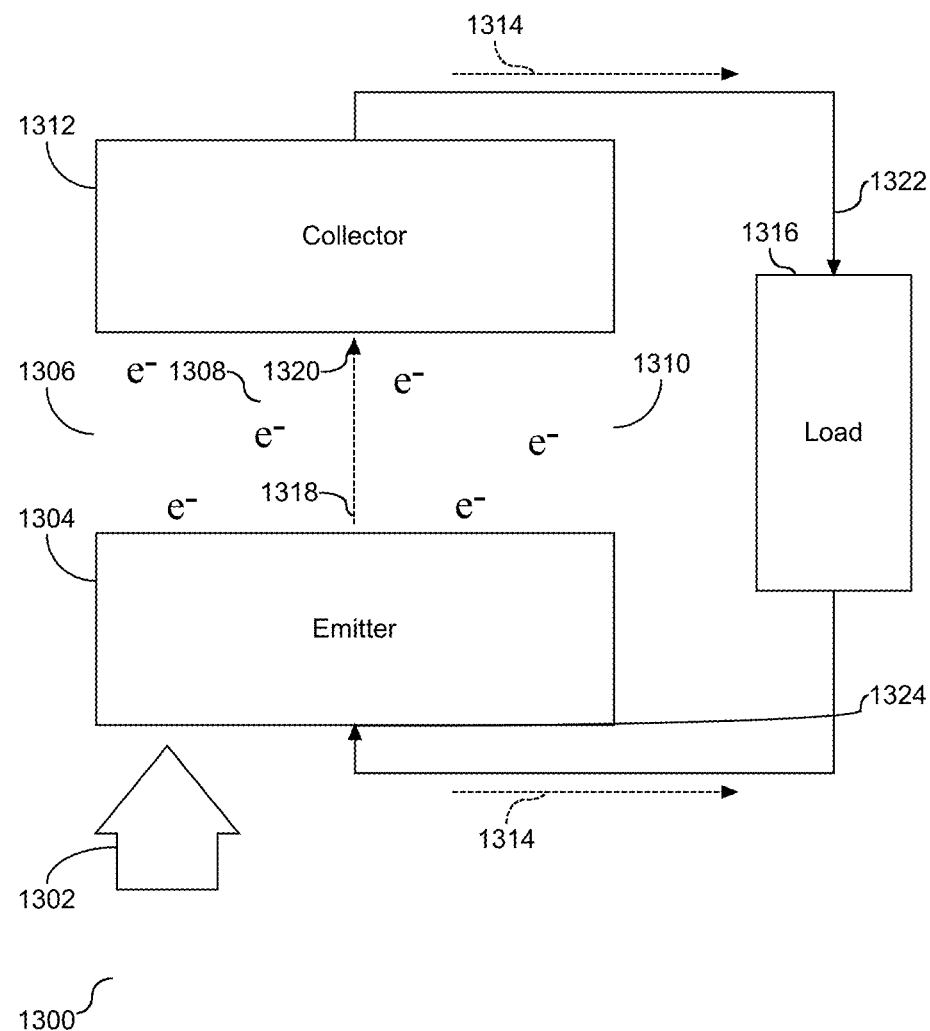
FIG. 13 depicts a schematic view of one embodiment of employment of the nano-scale energy conversion device.

Referring to FIG. 13, a diagram is provided illustrating one embodiment of employment of the nano-scale energy conversion device (1300). Heat energy (1302) from a source enters the emitter electrode (1304). Electrons (1306) are thermionically emitted (1318) from the emitter electrode (1304). The electrons (1306) traverse the cavity (1308) that is filled with nanofluid (1310) as described herein. The electrons (1306) reach (1320) the collector electrode (1312) that collects the electrons (1306) to generate an output current (1314) that is transmitted through a first electrical conductor (1322) to a load (1316) to perform work. Current (1314) is transmitted from the load (1316) to the emitter (1304) through a second electrical conductor (1324).

Accordingly, the nano-scale energy conversion device (1300) harvests heat energy (1302), including waste heat and ambient heat, to generate electrical power (1314).

Figure 14:
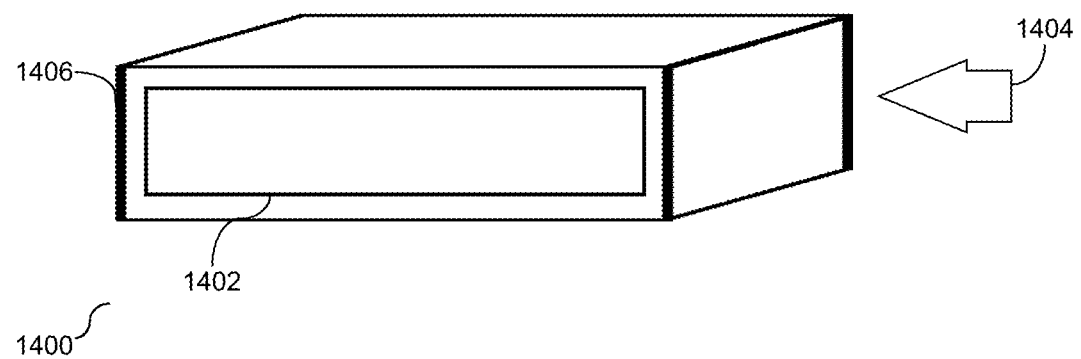
FIG. 14 depicts a schematic view of a system of stacked or grouped nano-scale energy conversion devices to that generates electric power from waste heat.

Referring to FIG. 14, a diagram is provided illustrating a system (1400) of stacked or grouped nano-scale energy conversion devices (1402) that generates electric power from heat (1404), which in one embodiment is waste heat or waste heat by-product. The system (1400) includes a plurality of nano-scale energy conversion devices (1402) within an insulated casing (1406). Each nano-scale energy conversion device (1402) is capable of producing at least 0.024 watts/cell and the system (1400) can reach a power density of about 1550 watts/liter, therefore, about 64,583 devices (1402) would be required. For a particular residential dwelling that uses 3 kilowatts (kW), therefore a system (1400) to power a typical home would require about a 2 liter system. Stacked nano-scale energy conversion devices (1402) (in series or in parallel) define the power flux to obtain an electric power system of desired current and voltage characteristics. In addition, heat removal capabilities are enhanced through the additional devices (1402). Accordingly, the nano-scale energy conversion devices (1402) are scalable and configurable to provide electric power under a variety of uses.

Figure 15:
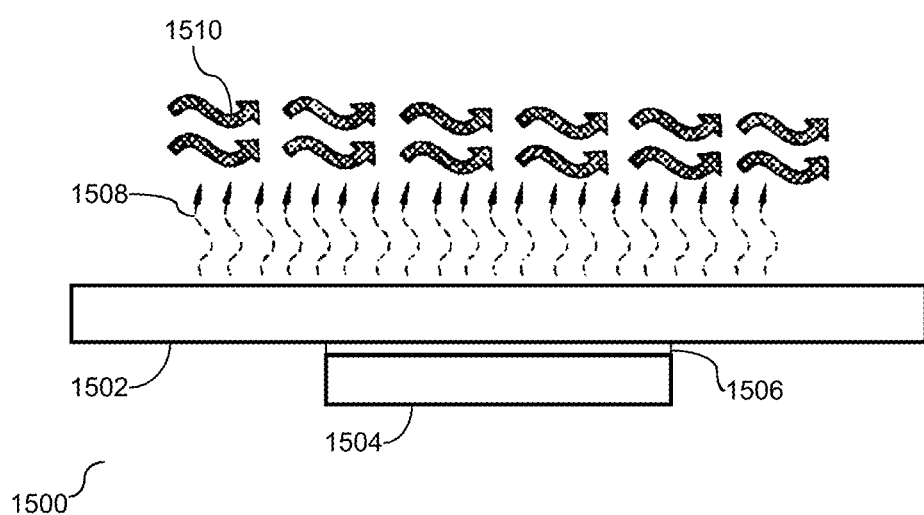
FIG. 15 depicts a cutaway view of waste heat harvesting system that includes a nano-scale energy conversion device coupled to an electronic chip that harvests electrical energy from waste heat from the electronic chip.

Referring to FIG. 15, a diagram is provided illustrating a waste heat harvesting system (1500) that includes a nano-scale energy conversion group (1502) coupled to an electronic chip (1504), such as a semi-conductor chip that harvests electrical energy from waste heat from the electronic chip (1504). Such a system (1500) is suitable for use in mobile phones and other portable electronic devices. The electronic chip (1504) is affixed to the nano-scale energy conversion group (1502) with an adhesive (1506), e.g., without limitation, an epoxy adhesive. The group of stacked nano-scale energy conversion devices (1502) includes, e.g., and without limitation, about 35 stacked nano-scale energy conversion devices. In one embodiment, the quantity of stacked nano-scale energy conversion devices may range depending on the size and dimensions of the semi-conductor chip. For example, in one embodiment, the quantity may range from a minimum of 1 to in excess of 1,000 stacked nano-scale energy conversion devices. Similarly, in one embodiment, the stacking of multiple nano-scale energy conversion devices forms layers thereof. The nano-scale energy conversion group (1502) is cooled by both radiation heat transfer (1508) and natural convection heat transfer (1510). The nano-scale energy conversion group (1502) is driven by a temperature difference where the electronic chip (1504) is operating at about 100° C. The harvested electrical power does not need to be used to cool the system (1500). The nano-scale energy conversion group (1502) includes a predetermined number of nano-scale energy conversion devices for multiplying currents and voltages as necessary. Accordingly, a nano-scale energy conversion group (1502) can be cooled by combined natural convection and radiation, and there may be no need to install any power-consuming fluid movers.

Figure 16:
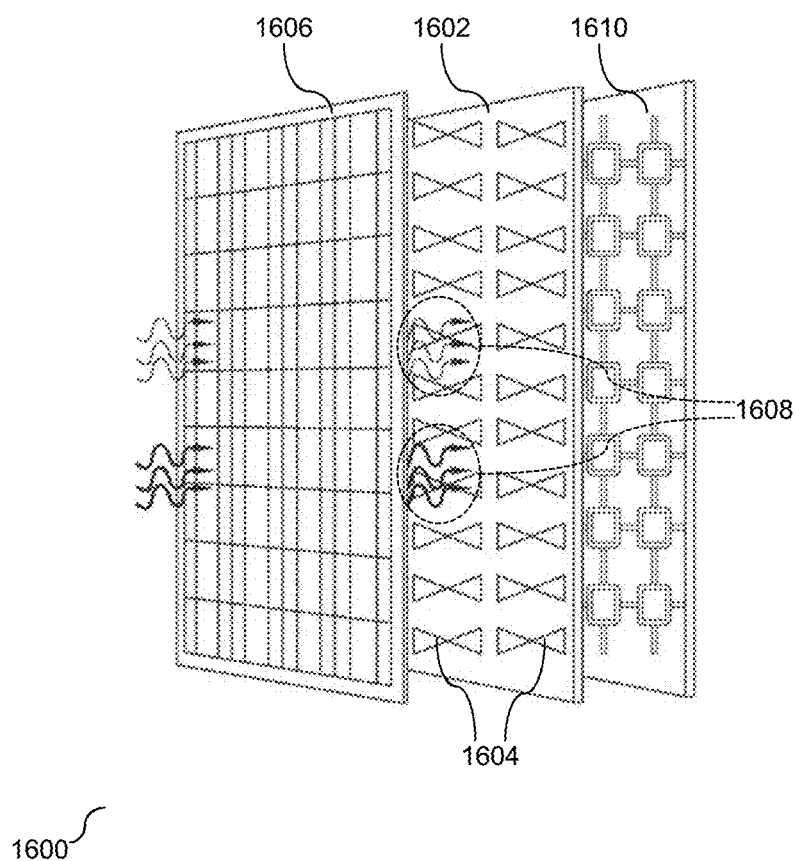
FIG. 16 depicts an exploded view of an electric power generation system that includes an array of nano-scale energy conversion devices coupled to an array of solar cells that harvests electrical energy from waste heat from the solar cell array.

Referring to FIG. 16, a diagram is provided illustrating an electric power generation system (1600) that includes an array (1602) of nano-scale energy conversion devices (1604) coupled to an array of solar cells (1606) that harvests electrical energy from heat byproduct (1608) from the solar cell array (1606). An energy storage device (1610), such as, and without limitation, an ultra-capacitor, is electrically connected to the array (1602) of nano-scale energy conversion devices (1604). Integration of the nano-scale energy conversion devices (1604) into electric power generation system (1600) allows the array (1602) to both cool the solar cell array (1606) and synergistically generate power to augment photovoltaic production. In addition to enhancing photovoltaic power generation, the integration of the nano-scale energy conversion devices (1604) augments other thermal power sources such as hot water, geothermal sources, and automotive waste heat sources, to enhance the generation of electrical power. Accordingly, the nano-scale energy conversion devices (1604) can be integrated with multiple energy-harvesting devices to produce a greater energy-density device that would otherwise not be accomplished without the integration.

As described herein, the present disclosure is directed generally to an ultra-long life energy source, such as a battery, and more particularly is directed to a nano-scale energy conversion device. Ionization is provided therein by the combination of electron tunneling and thermionic emission of the nano-scale energy conversion device. Charge transfer therein is effected through conductive nanoparticles suspended in a fluid (i.e., a nanofluid) undergoing collisions driven by thermally-induced Brownian motion. The design of this device enables ambient energy extraction at low and elevated temperatures (including room temperature). To this end, the electrodes are very close to each other to allow electrons to travel the distance between them. These electrons emitted at a wide range of temperatures proceed across the gap due to the nanofluid providing a conductive pathway for electrons, minimizing heat transfer to maintain a nanoscale heat engine, and preventing arcing. With respect to thermionic converters, the electrical efficiency of these devices depends on the very low work function materials deposited on the emitter electrode (cathode) and the collector electrode (anode). The efficiency of two low work function electrodes can be increased by developing cathodes with sufficient thermionic emission of electrons operating even at room temperature. These low work function cathodes and anodes provide copious amounts of electrons. Similarly, a tunneling device consists of two low work function electrodes separated by a designed nanofluid. Cooling by electrode emission refers to the transport of hot electrons across the nanofluid gap, from the object to be cooled (cathode) to the heat rejection electrode (anode). Thus, the coupling of several technologies, including: the electrospray-deposited two low work function electrodes include cesium-oxide on both tungsten and gold; an energy selective electron-transfer thermionic emission and quantum hopping of electrons; a nanofluid that is tailored as a thermoelectric element to conduct electricity while minimizing heat transfer within the device; and thermal communication from the anode electrical connection that is in thermal contact with the device and the outside heat reservoir, produces a viable thermionic power generator.

The nano-scale energy conversion devices described herein facilitate generating electrical energy via a long-lived, constantly-recharging, battery for any size-scale electrical application. The devices provide a battery having a conversion efficiency superior to presently available single and double conversion batteries. In addition, the devices described herein may be fabricated as an integral part of, and provide electrical energy for, an integrated circuit. The devices described herein are a light-weight and compact multiple-conversion battery having a relatively long operating life with an electrical power output at a useful value. Furthermore, in addition to the tailored work functions, the nanoparticle clusters described herein are multiphase nanocomposites that include thermoelectric materials. The combination of thermoelectric and thermionic functions within a single device further enhances the power generation capabilities of the nano-scale energy conversion devices.

The conversion of ambient heat energy into usable electricity enables energy harvesting capable of offsetting, or even replacing, the reliance of electronics on conventional power supplies, such as electrochemical batteries, especially when long-term operation of a large number of electronic devices in dispersed locations is required. Energy harvesting distinguishes itself from batteries and hardwire power owing to inherent advantages, such as outstanding longevity measured in years, little maintenance, and minimal disposal and contamination issues. The nano-scale energy conversion devices described herein demonstrate a novel electric generator with low cost for efficiently harvesting thermal energy (without the need for an initial temperature differential or thermal gradient to start the electron flow).

The nano-scale energy conversion devices described herein are scalable across a large number of power generation requirements. The devices may be designed for applications requiring electric power in the milliwatts (mW), watts (W), kilowatts (kW), and megawatts (MW) ranges. Examples of devices for the mW range include, but are not limited to, those devices associated with the Internet of Things (IoT) (home appliances, vehicles (communication only)), handheld portable electronic devices (mobile phones, medical devices, tablets), and embedded systems (RFIDs and wearables). Examples of devices for the watts range include, but are not limited to, handheld sensors, networks, robotic devices, cordless tools, drones, appliances, toys, vehicles, utility lighting, and edge computing. Examples of devices in the kW range include, but are not limited to, residential off-grid devices (rather than backup fossil fuel generators), resilient/sustainable homes, portable generators, electric and silent transportation (including waterfaring), and spacecraft. Examples of devices in the MW range include, but are not limited to, industrial/data center/institutional off-grid devices (e.g., uninterruptible power supplies), resilient complexes, urban centers, commercial and military aircraft, flying cars, and railway/locomotive/trucking/shipboard transportation. Accordingly, substantially any power demand in any situation can be met with the devices disclosed herein.

Aspects of the present embodiments are described herein with reference to one or more of flowchart illustrations and/or block diagrams of methods and apparatus (systems) according to the embodiments.

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles of the embodiments and the practical application, and to enable others of ordinary skill in the art to understand the embodiments for various embodiments with various modifications as are suited to the particular use contemplated. The implementation of the nano-scale energy conversion devices as heat harvesting devices that efficiently convert waste heat energy to usable electric energy facilitates flexible uses of the minute power generators. Accordingly, the nano-scale energy conversion devices and the associated embodiments as shown and described in FIGS. 1-16, provide electrical power through conversion of heat in most known environments, including ambient, ambient temperature environments.

It will be appreciated that, although specific embodiments have been described herein for purposes of illustration, various modifications may be made without departing from the spirit and scope of the embodiments. In particular, the nano-scale energy conversion devices are shown as configured to harvest waste heat from stationary or relatively stationary conditions. Alternatively, the nano-scale energy conversion devices may be configured to harvest waste heat while in motion. Accordingly, the scope of protection of the embodiment(s) is limited only by the following claims and their equivalents.

What is claimed is:

1. A method of manufacturing an electric power generator comprising:
   fabricating a first electrode comprising:
      providing a first electrode substrate including at least a first material, wherein the first material has a first work function value, the first material including tungsten (W); and
      depositing at least one second material, different from the first material, over at least a portion of the first material, the deposit of the at least one second material creating a second work function value for the first electrode, the second work function value being less than the first work function value, and the second material including cesium oxide ($Cs_2O$);
   fabricating a second electrode comprising:
      providing a second electrode substrate including at least one third material different from the first and second materials, wherein the third material has a third work function value, the third material including gold (Au); and
      depositing at least one fourth material, different from the first and third materials, over at least a portion of the at least one third material, the deposit of the at least one fourth material creating a fourth work function value for the second electrode, the fourth work function value being less than the third work function value, and the fourth material including $Cs_2O$;
   positioning the second electrode a distance from the first electrode, the distance at least partially defining a cavity between the first and second electrodes; and
   adding a nanofluid to the cavity, wherein the nanofluid includes a plurality of nanoparticles and a dielectric medium, wherein the plurality of nanoparticles have a nanoparticle work function value greater than the first and second work function values and wherein the dielectric medium comprises a sol-gel.

2. The method of claim 1, wherein depositing at least one second material comprises:
   extending the second material over about 60% of a first surface of the first substrate.

3. The method of claim 1, wherein depositing at least one fourth material comprises:
   extending the fourth material over about 60% of a second surface of the second substrate.

4. The method of claim 1, wherein depositing at least one second material comprises:
   using an electrospray of monodispersed droplets of $Cs_2O$ deposited over the portion of the first material.

5. The method of claim 4, further comprising
   forming a plurality of dipoles on a surface of at least one layer of $Cs_2O$, wherein the dipoles define nano antennas.

6. The method of claim 5, further comprising:
   the nanoantennas modifying a proximate dipole moment.

7. The method of claim 1, wherein the distance comprises a range of about 1 nanometer to less than 10 nanometers.

8. The method of claim 1, wherein the first electrode is an emitter and the second electrode is a collector.

9. The method of claim 1, further comprising:
   manufacturing the nanofluid by suspending the plurality of nanoparticles in the dielectric medium.

10. The method of claim 1, further comprising:
    electrically connecting a first electrical conductor to the first electrode;
    electrically connecting a second electrical conductor to the second electrode; and
    electrically connecting the first conductor to the second conductor.

11. The method of claim 1, wherein fabricating the first electrode further comprises:
    adding at least one material selected from the group consisting of: lead selenide telluride (PbSeTe) and lead telluride (PbTe) to the first material, wherein the added at least one material converts thermal energy to electrical energy.

12. The method of claim 11, further comprising:
    adding an n-type compound to the first material, the compound doped with a transition metal selected from the group consisting of: bismuth (Bi) and antimony (Sb), wherein the transition metal converts thermal energy to electrical energy.

13. The method of claim 1, further comprising selecting the nanofluid and adding the selected nanofluid to the cavity for operation in at least one of a first and second temperature range, including the first temperature range limited to thermionic conversion and the second temperature range limited to thermionic and thermoelectric conversion.

14. A method of manufacturing an electric power generator comprising:
    fabricating a first electrode comprising:
      depositing a first electrode substrate including at least a first material on a first graphene film, wherein the first material has a first work function value; and
      depositing at least one second material, different from the first material, over at least a portion of the first material, the deposit of the at least one second material creating a second work function value for the first electrode, the second work function value being less than the first work function value, and the second material including cesium oxide ($Cs_2O$);
    fabricating a second electrode comprising:
      depositing a second electrode substrate including at least one third material on a second graphene film, wherein the third material is different from the first and second materials and has a third work function value; and
      depositing at least one fourth material, different from the first and third materials, over at least a portion of the at least one third material, the deposit of the at least one fourth material creating a fourth work function value for the second electrode, the fourth work function value being less than the third work function value, and the fourth material including $Cs_2O$;
    positioning the second electrode a distance from the first electrode, the distance at least partially defining a cavity between the first and second electrodes; and
    adding a nanofluid to the cavity, wherein the nanofluid includes a plurality of nanoparticles, wherein the plurality of nanoparticles have a nanoparticle work function value greater than the first and second work function values.

15. The method of claim 14, wherein:
    the first material includes tungsten (W); and
    the third material includes gold (Au).

16. The method of claim 14, wherein the nanofluid is suspended in a dielectric medium, the dielectric medium comprising a sol-gel.

17. The method of claim 14, wherein:
    the fabricating the first electrode further comprises:
      positioning the first graphene film on a first sacrificial polymer base prior to the depositing of the first electrode substrate; and
      removing the first sacrificial polymer base from the first graphene film; and
    the fabricating the second electrode further comprises:
      positioning the second graphene film on a second sacrificial polymer base prior to the depositing of the second electrode substrate; and
      removing the second sacrificial polymer base from the second graphene film.

18. The method of claim 17, wherein the nanofluid is suspended in a dielectric medium, the dielectric medium comprising a sol-gel.

19. The method of claim 14, wherein depositing at least one second material comprises:
    extending the second material over about 60% of a first surface of the first substrate.

20. The method of claim 14, wherein depositing at least one fourth material comprises:
    extending the fourth material over about 60% of a second surface of the second substrate.

21. The method of claim 14, wherein the distance comprises a range of about 1 nanometer to less than 10 nanometers.

22. A method of manufacturing an electric power generator comprising:
    fabricating a first electrode comprising:
      providing a first electrode substrate including at least a first material, wherein the first material has a first work function value; and
      depositing at least one second material, different from the first material, over at least a portion of the first material, the deposit of the at least one second material creating a second work function value for the first electrode, the second work function value being less than the first work function value, and the second material including cesium oxide ($Cs_2O$);

fabricating a second electrode comprising:
providing a second electrode substrate including at least one third material different from the first and second materials, wherein the third material has a third work function value; and depositing at least one fourth material, different from the first and third materials, over at least a portion of the at least one third material, the deposit of the at least one fourth material creating a fourth work function value for the second electrode, the fourth work function value being less than the third work function value, and the fourth material including $Cs_2O$;

positioning the second electrode a distance from the first electrode, the distance at least partially defining a cavity between the first and second electrodes; and suspending a nanofluid in a dielectric medium in the cavity, wherein the nanofluid includes a plurality of nanoparticles, wherein the plurality of nanoparticles have a nanoparticle work function value greater than the first and second work function values, and wherein the dielectric medium comprises a sol-gel.

23. The method of claim 22, wherein:
the first material includes tungsten (W); and
the third material includes gold (Au).

24. The method of claim 22, wherein:
depositing at least one second material comprises extending the second material over about 60% of a first surface of the first substrate; and
depositing at least one fourth material comprises extending the fourth material over about 60% of a second surface of the second substrate.

25. The method of claim 22, wherein the distance comprises a range of about 1 nanometer to less than 10 nanometers.

* * * * *